(12) United States Patent
Carr et al.

(10) Patent No.: US 11,152,395 B1
(45) Date of Patent: Oct. 19, 2021

(54) MONOLITHIC MULTI-FETS

(71) Applicant: X-Celeprint Limited, Dublin (IE)

(72) Inventors: Joseph Carr, Chapel Hill, NC (US);
Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 0 days.

(21) Appl. No.: 17/096,688

(22) Filed: Nov. 12, 2020

(51) Int. Cl.
*H01L 27/12* (2006.01)
*H01L 21/84* (2006.01)
*H01L 21/78* (2006.01)
*H01L 29/76* (2006.01)

(52) U.S. Cl.
CPC .......... *H01L 27/1203* (2013.01); *H01L 21/78* (2013.01); *H01L 21/84* (2013.01); *H01L 29/76* (2013.01)

(58) Field of Classification Search
CPC ..... H01L 27/1203; H01L 21/78; H01L 21/84; H01L 29/7881; H01L 29/7885; H01L 28/76; H01L 31/062
USPC ......... 257/347, 350, 351; 438/149, 479, 517
See application file for complete search history.

(56) References Cited

U.S. PATENT DOCUMENTS

| | | | |
|---|---|---|---|
| 5,889,302 A | 3/1999 | Liu | |
| 6,462,364 B1 * | 10/2002 | Horiuchi | H01L 29/76 257/261 |
| 7,307,298 B2 | 12/2007 | Yamane et al. | |
| 7,547,917 B2 | 6/2009 | Gauthier, Jr. et al. | |
| 7,622,367 B1 | 11/2009 | Nuzzo et al. | |
| 8,394,116 B2 | 3/2013 | Kota et al. | |
| 8,506,867 B2 | 8/2013 | Menard | |
| 8,686,428 B1 | 4/2014 | Sekar et al. | |
| 8,722,458 B2 | 5/2014 | Rogers et al. | |
| 8,835,940 B2 | 9/2014 | Hu et al. | |
| 8,933,433 B2 | 1/2015 | Higginson et al. | |
| 9,520,537 B2 | 12/2016 | Bower et al. | |
| 9,741,906 B2 | 8/2017 | Tischler et al. | |
| 10,037,985 B2 | 7/2018 | De Winter et al. | |
| 2004/0014299 A1 | 1/2004 | Moriceau et al. | |
| 2016/0093600 A1 | 3/2016 | Bower et al. | |
| 2016/0380154 A1 | 12/2016 | Machuca et al. | |
| 2017/0048976 A1 | 2/2017 | Prevatte et al. | |

* cited by examiner

*Primary Examiner* — Thinh T Nguyen
(74) *Attorney, Agent, or Firm* — William R. Haulbrook; Michael D. Schmitt; Choate, Hall & Stewart LLP

(57) ABSTRACT

A monolithic multi-FET transistor comprises an epitaxial layer disposed on a dielectric layer. The epitaxial layer comprises a crystalline semiconductor material and a multi-FET area. An isolation structure surrounds the multi-FET area and divides the multi-FET area into separate FET portions. A gate disposed on a gate dielectric extends over each FET portion. A source and a drain are each disposed on opposite sides of the gate on the epitaxial layer within each FET portion. Each gate, source, and drain comprise a separate electrical conductor and the gate, source, drain, and epitaxial layer within each FET portion form a field-effect transistor. Gate, source, and drain contacts electrically connect the gates, sources, and drains of the separate FET portions, respectively. At least the sources or drains of two neighboring FET portions are disposed in common over at least a portion of the isolation structure dividing the two neighboring FET portions.

21 Claims, 19 Drawing Sheets

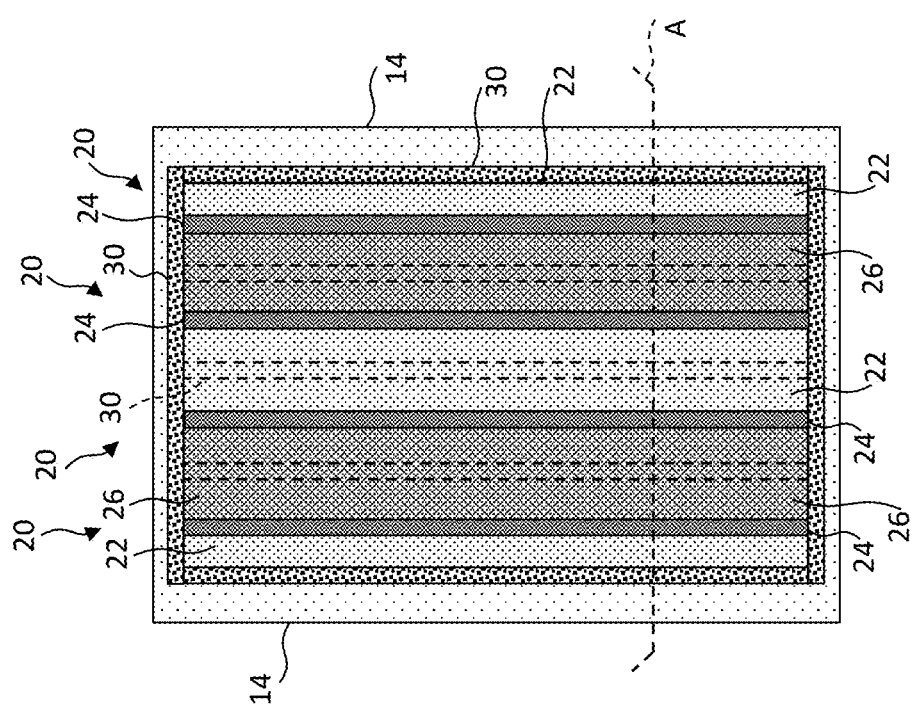

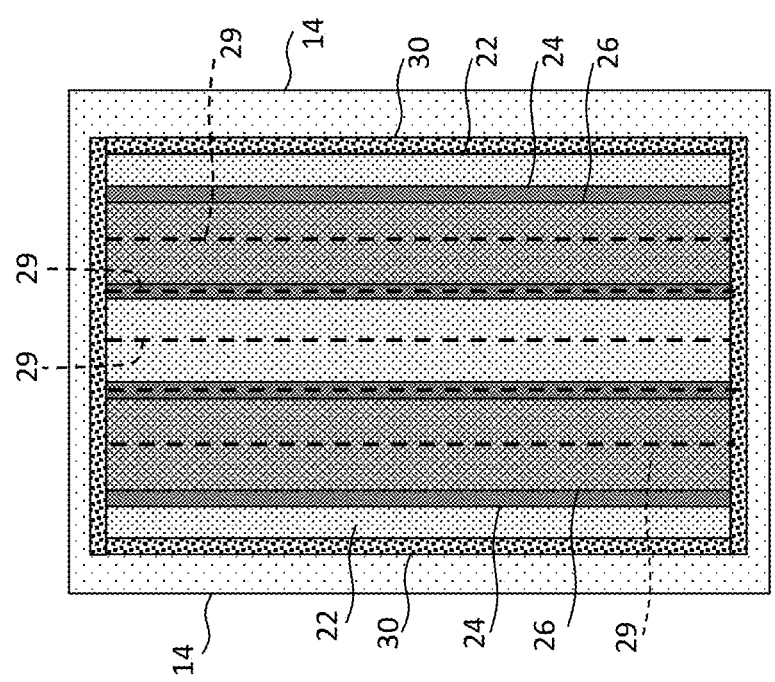

MONOLITHIC MULTI-FETS

FIELD OF THE DISCLOSURE

The present disclosure relates to power transistors and methods and structures for providing improved power transistor miniaturization, density, and efficiency.

BACKGROUND

Power transistors are widely used in electronic systems to provide electricity to integrated circuits. As electronic devices continue to decrease in size and increase in functionality, their power usage increases and the distribution of power in electronic systems becomes increasingly challenging. Power transistors typically switch or control much larger currents and voltages than logic circuits (e.g., a Watt or more). Consequently, the efficiency of power transistors, and the efficiency with which power can be delivered to electronic circuits is an important factor in electronic system design. Field-effect transistors (FETs) are one common class of power transistors.

Conventional power transistors are individually packaged, often with an integrated heat sink, and provided on printed circuit boards in electronic systems and are consequently relatively large compared to logic circuits. More recently, an unpackaged power transistor provided directly on a silicon circuit was described in U.S. Pat. No. 10,037, 985 entitled Compound Micro-Transfer-Printed Power Transistor Device. This disclosure illustrates an unpackaged power transistor micro-transfer printed on a controller and formed in a different semiconductor material than the controller.

Power distribution and heating in an electronic system can be a limiting factor in the electronic system performance. Resistive losses and parasitic capacitance and inductance can limit power delivery over a system substrate. To some extent, such losses can be mitigated by providing higher voltages to the electronic system and by converting the higher voltages to a voltage used by low-voltage integrated circuits disposed close to the integrated circuits. In such designs, the size and efficiency of the power transistor is very important. There is a need, therefore, for power transistor and power-conversion structures that provide improved performance with a reduced size.

SUMMARY

Embodiments of the present disclosure provide a monolithic multi-FET transistor. The monolithic multi-transistor can comprise a single crystal of semiconductor material. According to some embodiments of the present disclosure, the monolithic multi-FET transistor comprises a dielectric layer and an epitaxial layer disposed on the dielectric layer. The epitaxial layer comprises a crystalline semiconductor material and a multi-FET area. An isolation structure is disposed in the epitaxial layer and extends from the dielectric layer through the epitaxial layer to a surface of the epitaxial layer opposite the dielectric layer. The isolation structure surrounds the multi-FET area and divides the multi-FET area into separate FET portions. For each separate FET portion of the separate FET portions a respective gate dielectric extends over the separate FET portion and contacts the isolation structure at two separated locations, for example at opposite sides of the FET portion, a respective gate is disposed on the respective gate dielectric, a respective source is disposed on the epitaxial layer on a side of the respective gate, and a respective drain is disposed on the epitaxial layer on a side of the respective gate opposite the respective source. At least the respective gate, the respective source, the respective drain and the separate FET portion of the epitaxial layer form a field-effect transistor (FET). Each respective gate, source, and drain comprises a separate electrical conductor. A gate contact electrically connects the respective gate of each of the separate FET portions, a source contact electrically connects the respective sources of each of the separate FET portions, and a drain contact electrically connects the respective drain of each of the FET portions. At least the respective sources for two neighboring FET portions of the separate FET portions are a common source disposed over at least a portion of the isolation structure dividing the two neighboring FET portions or the respective drain of each of two neighboring FET portions are a common drain disposed over at least a portion of the isolation structure dividing the two neighboring FET portions, or both.

According to some embodiments, the monolithic multi-FET transistor comprises a bulk layer, wherein the dielectric layer is disposed on the bulk layer, and the bulk layer, the dielectric layer, and the epitaxial layer comprise a semiconductor substrate, for example silicon-on-insulator (SOI) substrate or wafer. The bulk layer and the epitaxial layer can both comprise a crystalline semiconductor material, for example a single crystal or a single same crystal. The crystalline semiconductor material of the bulk layer and the epitaxial layer can be the same crystalline semiconductor material or different crystalline semiconductor materials.

According to some embodiments, the monolithic multi-FET transistor comprises two or more separate FET portions, three or more separate FET portions, four or more separate FET portions, or five or more separate FET portions, or more. At least the sources of two neighboring FET portions can be a common source disposed over the isolation structure separating the two neighboring FET portions and the drains of two neighboring FET portions can be a common drain disposed over the isolation structure separating the two neighboring FET portions. The common source of two neighboring FET portions can be adjacent to the common drain of two neighboring FET portions and the common source and the common drain can overlap a common FET portion. Thus, a common source can extend over two first neighboring FET portions and the isolation structure separating the two first neighboring FET portions and a common drain can extend over second neighboring FET portions and the isolation structure separating the two second neighboring FET portions. In some embodiments, one of the two first neighboring FET portions is one of the two second neighboring FET portions.

According to some embodiments, the isolation structure divides the multi-FET area into a one-dimensional array of separate FET portions. According to some embodiments, the isolation structure divides the multi-FET area into a two-dimensional array of separate FET portions. According to some embodiments, the two neighboring FET portions are first neighboring FET portions adjacent in a first dimension of the two-dimensional array and two other neighboring FET portions in a second dimension of the two-dimensional array are second neighboring FET portions and the respective gate of the second neighboring FET portions are a common gate disposed over the isolation structure dividing the two second neighboring FET portions, the respective source of the second neighboring FET portions are a common source disposed over the isolation structure dividing the two second neighboring FET portions, and the respective drain of the second neighboring FET portions are a common drain disposed over the isolation structure dividing the two second neighboring FET portions.

According to some embodiments of the present disclosure, the epitaxial layer and the bulk layer comprise a common material. According to some embodiments, the epitaxial layer and the bulk layer comprise different materials. According to some embodiments, the semiconductor substrate comprises silicon, the epitaxial layer comprises silicon, or both. According to some embodiments of the present disclosure, the semiconductor substrate comprises a compound semiconductor, the epitaxial layer comprises a compound semiconductor, or both. According to some embodiments of the present disclosure, the semiconductor substrate comprises a semiconductor, such as silicon and the epitaxial layer comprises a compound semiconductor, such as GaN or GaAs.

According to some embodiments, the dielectric layer is an oxide layer. In embodiments comprising a bulk layer, dielectric layer is a buried oxide layer as is found in SOI wafers. According to some embodiments, the respective gate dielectric is a gate oxide.

According to some embodiments of the present disclosure, the monolithic multi-FET transistor is a power transistor.

According to some embodiments, (i) the respective gate is linear, (ii) the respective source is linear, (iii) the respective drain is linear, or (iv) any combination or all of (i), (ii), and (iii).

According to some embodiments, (i) the respective gate of the gates has a gate end and the gate contact electrically connects to the respective gate at the gate end, (ii) the respective source has a source end and the source contact electrically connects to the respective source at the source end, (iii) the respective drain has a drain end and the drain contact electrically connects to the respective drain at the drain end, or (iv) any combination or all of (i), (ii), and (iii). According to some embodiments, (i) each respective gate has two opposing gate ends and the gate ends are both electrically connected with the gate contact, (ii) each respective source has two opposing source ends and the source ends are both electrically connected with the source contact, (iii) each respective drain has two opposing drain ends and the drain ends are both electrically connected with the drain contact, or (iv) any combination or all of (i), (ii), and (iii). According to some embodiments, (i) the gate contact is disposed at least partially over the respective gate, (ii) the source contact is disposed at least partially over the respective source, (iii) the drain contact is disposed at least partially over the respective drain, or (iv) any combination or all of (i), (ii), and (iii).

According to some embodiments of the present disclosure, the gate, source, or drain contacts are more electrically conductive than the gate, source, or drain, respectively, so that (i) the gate contact is more electrically conductive than the respective gate, (ii) the source contact is more electrically conductive than the respective source, (iii) the drain contact is more electrically conductive than the respective drain, or (iv) any combination or all of (i), (ii), and (iii). According to some embodiments, $R_C < (R_E - R_T)$, where $R_C$ is the sum of the resistances of the contact portions of the gate contact, source contact, or drain contact, $R_T$ is the resistance of the gate, source, and drain, respectively, and $R_E$ is the resistance of the equivalent gate, source, or drain, respectively.

According to some embodiments of the present disclosure, a monolithic multi-FET wafer comprises a plurality of monolithic multi-FET transistors and the epitaxial layer, the dielectric layer, the bulk layer, or the semiconductor substrate is common to the plurality of monolithic multi-FET transistors. The bulk layer can comprise a sacrificial layer comprising separate sacrificial portions and anchor portions and each monolithic multi-FET transistor can be entirely disposed over a sacrificial portion in a direction orthogonal to a surface of the epitaxial layer, bulk layer, dielectric layer or sacrificial portion. Each monolithic multi-FET transistor can be physically connected to an anchor portion of the anchor portions with at least one tether.

According to some embodiments of the present disclosure, a monolithic multi-FET system comprises a monolithic multi-FET transistor and a multi-FET controller disposed on, over, directly on, or directly on a layer, such as an electrically insulating layer, the monolithic multi-FET transistor, for example in a direction orthogonal to a surface of the monolithic multi-FET transistor. Electrical conductors such as electrodes can electrically connect the multi-FET controller to the monolithic multi-FET transistor. The multi-FET controller can be operable to control or operate the monolithic multi-FET transistor. The multi-FET controller can be micro-transfer printed onto the monolithic multi-FET transistor and can comprise a broken, fractured, or separated tether. A layer of adhesive can adhere the multi-FET controller to the monolithic multi-FET transistor. The multi-FET controller can comprise a semiconductor material that is different from the crystalline semiconductor material of the epitaxial layer.

According to some embodiments of the present disclosure, a monolithic multi-FET system comprises a first monolithic multi-FET transistor and a second monolithic multi-FET transistor. The second monolithic multi-FET transistor can be disposed on or over the first monolithic multi-FET transistor, e.g., directly over or in contact with first monolithic multi-FET transistor in a direction orthogonal to a surface of the first monolithic multi-FET transistor. An electrical conductor (e.g., an electrode) electrically connects the gate contact of the first monolithic multi-FET transistor to the gate contact of the second monolithic multi-FET transistor, an electrical conductor (e.g., an electrode) electrically connects the source contact of the first monolithic multi-FET transistor to the source contact of the second monolithic multi-FET transistor, and an electrical conductor (e.g., an electrode) electrically connects the drain contact of the first monolithic multi-FET transistor to the drain contact of the second monolithic multi-FET transistor, so that the first monolithic multi-FET transistor and the second monolithic multi-FET transistor are electrically connected in parallel. According to some embodiments, the first monolithic multi-FET transistor has a first area and the second monolithic multi-FET transistor has a second area, and the first area is greater than the second area. According to some embodiments, the first monolithic multi-FET transistor has a first number of FETs and the second monolithic multi-FET transistor has a second number of FETs, and the first number of FETs is greater than the second number of FETs. According to some embodiments, the first monolithic multi-FET transistor has a first size of FETs and the second monolithic multi-FET transistor has a second size of FETs, and the first size of FETs is greater than the second size of FETs.

According to some embodiments of the present disclosure, a method of making a monolithic multi-FET wafer comprises providing an epitaxial layer disposed on a dielectric layer, the epitaxial layer comprising a crystalline semiconductor material and a multi-FET area, disposing an isolation structure in the epitaxial layer and extending from a surface of the epitaxial layer through the epitaxial layer to the dielectric layer, the isolation structure surrounding the multi-FET area and dividing the multi-FET area into separate FET portions, and forming a plurality of monolithic multi-FETs on the semiconductor substrate, the forming comprising disposing gate dielectrics that each extend over a different FET portion of the separate FET portions and contacts the isolation structure at two separated locations, disposing a gate on each gate dielectric of the gate dielectrics, a source on the epitaxial layer within each FET portion of the separate FET portions on a side of the gate, and a drain on the epitaxial layer within each FET portion of the separate FET portions on a side of the gate opposite the source, wherein each gate, source, and drain comprise a separate electrical conductor and electrically connecting (i) the gate of each of the separate FET portions with a gate contact, (ii) the source of each of the separate FET portions with a source contact, and (iii) the drain of each of the separate FET portions with a drain contact, wherein at least one of (i) the source of each of two neighboring FET portions of the separate FET portions is a common source disposed over a portion of the isolation structure dividing the two neighboring FET portions and (ii) the drain of each of two neighboring FET portions is a common drain disposed over a portion of the isolation structure dividing the two neighboring FET portions.

According to some embodiments, methods of the present disclosure comprise providing a bulk layer, the dielectric layer disposed on the bulk layer, and the bulk layer, the dielectric layer, and the epitaxial layer comprising a semiconductor substrate. In some embodiments, methods comprise providing the semiconductor substrate and providing the semiconductor substrate comprises providing the bulk layer comprising a sacrificial layer comprising separate sacrificial portions and anchor portions and wherein each of the plurality of multi-FET transistors is entirely disposed over one of the sacrificial portions and is physically connected to an anchor portion of the anchor portions with at least one tether.

According to some embodiments, methods of the present disclosure comprise providing a target substrate, etching the sacrificial portions, and micro-transfer printing the plurality of monolithic multi-FET transistors from the bulk layer to the target substrate.

According to some embodiments, a method of making a monolithic multi-FET system comprises providing a monolithic multi-FET transistor, providing a multi-FET controller and disposing the multi-FET controller over or on the monolithic multi-FET transistor, for example by printing (e.g., micro-transfer printing) the multi-FET controller from a multi-FET controller source wafer, and electrically connecting the multi-FET controller to the monolithic multi-FET transistor with electrical conductors.

According to some embodiments of the present disclosures, a method of making a monolithic multi-FET system comprises providing a first monolithic multi-FET transistor, providing a second monolithic multi-FET transistor, and disposing the second monolithic multi-FET transistor on or over the first monolithic multi-FET transistor, for example by micro-transfer printing, electrically connecting the gate contact of the first monolithic multi-FET transistor to the gate contact of the second monolithic multi-FET transistor, electrically connecting the source contact of the first monolithic multi-FET transistor to the source contact of the second monolithic multi-FET transistor, and electrically connecting the drain contact of the first monolithic multi-FET transistor to the drain contact of the second monolithic multi-FET transistor so that the first monolithic multi-FET transistor and the second monolithic multi-FET transistor are electrically connected in parallel.

According to some embodiments of the present disclosure, a monolithic multi-FET transistor comprises a dielectric layer and an epitaxial layer disposed on the dielectric layer, the epitaxial layer comprising a crystalline semiconductor material and a multi-FET area and an isolation structure disposed in the epitaxial layer and extending from the dielectric layer through the epitaxial layer to a surface of the epitaxial layer opposite the dielectric layer, the isolation structure surrounding the multi-FET area and dividing the multi-FET area into separate FET portions. Each separate FET portion of the separate FET portions comprises a respective gate dielectric that extends over the separate FET portion that contacts the isolation structure at two separated locations, a respective gate disposed on the respective gate dielectric, a respective source disposed on the epitaxial layer on a side of the respective gate, and a respective drain disposed on the epitaxial layer on a side of the respective gate opposite the respective source. At least the respective gate, the respective source, the respective drain and the separate FET portion of the epitaxial layer form a field-effect transistor (FET). A gate contact electrically connects the respective gate of each of the separate FET portions, a source contact electrically connects the respective source of each of the separate FET portions, and a drain contact electrically connects the respective drain of each of the FET portions. At least one of (i) the respective source for two neighboring FET portions of the separate FET portions is a common source disposed over at least a portion of the isolation structure dividing the two neighboring FET portions and (ii) the respective drain for two neighboring FET portions is a common drain disposed over at least a portion of the isolation structure dividing the two neighboring FET portions.

According to some embodiments, the separate FET portions comprise three or more separate FET portions and at least the respective source for two first neighboring FET portions is a common source disposed over the isolation structure separating the two first neighboring FET portions and the respective drains of for two second neighboring FET portions is a common drain disposed over the isolation structure separating the two second neighboring FET portions (e.g., one of the two first neighboring FET portions is one of the two second neighboring FET portions).

According to some embodiments, the isolation structure divides the multi-FET area into a one-dimensional array of separate FET portions. The isolation structure can divide the multi-FET area into a two-dimensional array of separate FET portions. The two neighboring FET portions can be first neighboring FET portions adjacent in a first dimension of the two-dimensional array and two other neighboring FET portions in a second dimension of the two-dimensional array can be second neighboring FET portions and the respective gate of the second neighboring FET portions can be a common gate disposed over the isolation structure dividing the two second neighboring FET portions. The respective source of the second neighboring FET portions can be a common source disposed over the isolation structure dividing the two second neighboring FET portions, and the respective drain of the second neighboring FET portions can be a common drain disposed over the isolation structure dividing the two second neighboring FET portions.

According to some embodiments, the epitaxial layer comprises silicon, the epitaxial layer comprises a compound semiconductor, the dielectric layer is a buried oxide layer, or the respective gate dielectric is a gate oxide.

According to some embodiments, the monolithic multi-FET transistor is a power transistor.

According to some embodiments, (i) the respective gate is linear, (ii) the respective source is linear, (iii) the respective drain is linear, or (iv) any combination of (i), (ii), and (iii).

According to some embodiments, (i) the respective gate has a gate end and the gate contact connects to the respective gate at the gate end, (ii) the respective source has a source end and the source contact connects to the respective source at the source end, (iii) the respective drain has a drain end and the drain contact connects to the respective drain at the drain end, or (iv) any combination of (i), (ii), and (iii). According to some embodiments, (i) the respective gate has two opposing gate ends and the gate ends are both electrically connected with the gate contact, (ii) the respective source has two opposing source ends and the source ends are both electrically connected with the source contact, (iii) the respective drain has two opposing drain ends and the drain ends are both electrically connected with the drain contact, or (iv) any combination of (i), (ii), and (iii).

According to some embodiments, (i) the gate contact is disposed at least partially over the respective gate, (ii) the source contact is disposed at least partially over the respective source, (iii) the drain contact is disposed at least partially over the respective drain, or (iv) any combination of (i), (ii), and (iii).

According to some embodiments, $R_C < (R_E - R_T)$, where $R_C$ is the sum of the resistances of the contact portions of the gate contact, source contact, or drain contact, $R_T$ is the resistance of the respective gate, the respective source, or the respective drain, respectively, and $R_E$ is the resistance of the equivalent gate, source, or drain, respectively. According to some embodiments, (i) the gate contact is more electrically conductive than the respective gate, (ii) the source contact is more electrically conductive than the respective source, (iii) the drain contact is more electrically conductive than the respective drain, or (iv) any combination of (i), (ii), and (iii).

According to some embodiments, a monolithic multi-FET wafer comprises a bulk layer of semiconductor material, a plurality of monolithic multi-FET transistors and the dielectric layer of each monolithic multi-FET transistors of the plurality of multi-FET transistors are disposed on the bulk layer, and the bulk layer is common to the plurality of monolithic multi-FET transistors. The bulk layer can comprise a sacrificial layer comprising separate sacrificial portions and anchor portions and each of the plurality of monolithic multi-FET transistors can be entirely disposed over one of the sacrificial portions and physically connected to an anchor portion of the anchor portions with at least one tether.

According to some embodiments, a monolithic multi-FET system comprises a monolithic multi-FET transistor, a multi-FET controller disposed on or over the monolithic multi-FET transistor, and electrical conductors electrically connecting the multi-FET controller to the monolithic multi-FET transistor, the multi-FET controller operable to control the multi-FET transistor. The multi-FET controller can comprise a broken or separated tether. According to some embodiments, the monolithic multi-FET system comprises a layer of adhesive adhering the multi-FET controller to the monolithic multi-FET transistor. The multi-FET controller can comprise a semiconductor material that is different from the crystalline semiconductor material of the epitaxial layer.

According to some embodiments of the present disclosure, a monolithic multi-FET system comprises a first monolithic multi-FET transistor and a second monolithic multi-FET transistor. The second monolithic multi-FET transistor can be disposed on or over the first monolithic multi-FET transistor. An electrical conductor electrically can connect the gate contact of the first monolithic multi-FET transistor to the gate contact of the second monolithic multi-FET transistor, an electrical conductor can electrically connect the source contact of the first monolithic multi-FET transistor to the source contact of the second monolithic multi-FET transistor, and an electrical conductor can electrically connect the drain contact of the first monolithic multi-FET transistor to the drain contact of the second monolithic multi-FET transistor, so that the first monolithic multi-FET transistor and the second monolithic multi-FET transistor are electrically connected in parallel. According to some embodiments, the first monolithic multi-FET transistor has a first area and the second monolithic multi-FET transistor has a second area, and the first area is greater than the second area. The first monolithic multi-FET transistor can have a first number of FETs and the second monolithic multi-FET transistor can have a second number of FETs, and the first number of FETs can be greater than the second number of FETs.

According to some embodiments of the present disclosure, a method of making a monolithic multi-FET wafer comprising providing a semiconductor substrate comprising a bulk layer, a dielectric layer disposed on the bulk layer, and an epitaxial layer disposed on the dielectric layer, the bulk layer and the epitaxial layer both comprising a crystalline semiconductor material, and the epitaxial layer comprising a multi-FET area, disposing an isolation structure in the epitaxial layer and extending from a surface of the epitaxial layer through the epitaxial layer to the dielectric layer, the isolation structure surrounding the multi-FET area and dividing the multi-FET area into separate FET portions, and forming a plurality of monolithic multi-FETs on the semiconductor substrate. In some embodiments, the forming comprises disposing gate dielectrics that each extend over a different FET portion of the separate FET portions and contacts the isolation structure at two separated locations, disposing a gate on each gate dielectric of the gate dielectrics, a source on the epitaxial layer within each FET portion of the separate FET portions on a side of the gate, and a drain on the epitaxial layer within each FET portion of the separate FET portions on a side of the gate opposite the source, wherein each gate, source, and drain comprise a separate electrical conductor, and electrically connecting (i) the gate of each of the separate FET portions with a gate contact, (ii) the source of each of the separate FET portions with a source contact, (iii) and the drain of each of the separate FET portions with a drain contact, At least one of (i) the source of each of two neighboring FET portions of the separate FET portions is a common source disposed over at least a portion of the isolation structure dividing the two neighboring FET portions and (ii) the drain of each of two neighboring FET portions is a common drain disposed over at least a portion of the isolation structure dividing the two neighboring FET portions.

According to some methods of the present disclosure, providing the epitaxial layer and the dielectric layer comprises providing a semiconductor substrate comprising a bulk layer on which the dielectric layer is disposed, the bulk layer comprising a sacrificial layer comprising separate sacrificial portions and anchor portions. Each of the plurality of monolithic multi-FET transistors can be entirely disposed over one of the separate sacrificial portions and can be physically connected to an anchor portion of the anchor portions with at least one tether. Some methods of the present disclosure comprise providing a target substrate, etching the sacrificial portions, and printing the plurality of monolithic multi-FET transistors from the bulk layer to the target substrate.

According to some embodiments of the present disclosure, a method of making a monolithic multi-FET system comprises providing a monolithic multi-FET transistor, providing a multi-FET controller, disposing the multi-FET controller over or on the monolithic multi-FET transistor, and electrically connecting the multi-FET controller to the monolithic multi-FET transistor with electrical conductors, the multi-FET controller operable to control the multi-FET transistor. Disposing the multi-FET controller can comprise printing the multi-FET controller from a multi-FET controller source wafer to the monolithic multi-FET transistor.

According to some embodiments of the present disclosure, a method of making a monolithic multi-FET system comprises providing a first monolithic multi-FET transistor, providing a second monolithic multi-FET transistor, disposing the second monolithic multi-FET transistor on or over the first monolithic multi-FET transistor, electrically connecting the gate contact of the first monolithic multi-FET transistor to the gate contact of the second monolithic multi-FET transistor, electrically connecting the source contact of the first monolithic multi-FET transistor to the source contact of the second monolithic multi-FET transistor, and electrically connecting the drain contact of the first monolithic multi-FET transistor to the drain contact of the second monolithic multi-FET transistor, so that the first monolithic multi-FET transistor and the second monolithic multi-FET transistor are electrically connected in parallel.

According to some embodiments of the present disclosure, a monolithic multi-FET transistor comprises a semiconductor substrate comprising a semiconductor epitaxial layer, an isolation structure disposed in, and extending through, the epitaxial layer, the isolation structure defining separate FET portions, respective field-effect transistors (FETs), each disposed on one of the separate FET portions and comprising a gate, a source, and a drain. The gates of the respective FETs can be electrically connected together, the sources of the respective FETs can be electrically connected together, and the drains of the respective FETs can be electrically connected together, and at least one of (i) two of the respective FETs can comprise a common source that extends over the isolation structure and (ii) two of the respective FETs can comprise a common source that extends over the isolation structure.

According to some embodiments of the present disclosure, a method of making a monolithic multi-FET transistor comprises providing a semiconductor substrate comprising a semiconductor epitaxial layer, patterning an isolation structure disposed in, and extending through, the epitaxial layer, the isolation structure defining separate FET portions, forming respective field-effect transistors (FETs), each disposed on one of the separate FET portions and comprising a gate, a source, and a drain, wherein at least one of (i) two of the respective FETs comprise a common source that extends over the isolation structure and (ii) two of the respective FETs comprise a common source that extends over the isolation structure, and electrically connecting (i) the gate of each of the respective FETs together, (ii) the source of each of the respective FETs together, and (iii) the drain of each of the respective FETs together.

According to some embodiments of the present disclosure, a monolithic multi-FET transistor comprises a substrate comprising a patterned single-crystalline semiconductor epitaxial layer defining separate FET portions and a plurality of FETs disposed on the substrate, wherein each of the plurality of FETs comprises one of the separate FET portions. According to some embodiments, the separate FET portions of the epitaxial layer are isolated by a common isolation structure. The isolation structure can be a patterned isolation structure extending through the epitaxial layer. At least one of (i) two of the plurality of FETs can comprise a common drain, and (ii) two of the plurality of FETs can comprise a common source. Each of the plurality of FETs can comprise a gate, a drain, and a source and the gates can be electrically connected by a gate conductor, the drains can be electrically connected by a drain conductor, and the sources can be electrically connected by a source conductor.

According to some embodiments, the substrate comprises an insulating (e.g., dielectric) layer and the patterned epitaxial layer is disposed on the insulating layer. The substrate can comprise a bulk semiconductor layer and the insulating layer can be disposed on the bulk semiconductor layer. According to some embodiments, the substrate is a silicon-on-insulator (SOI) substrate.

According to some embodiment, each of the plurality of FETs comprises a gate, a gate dielectric, a source, a drain and the one of the separate FET portions. The gate dielectric can span the one of the separate FET portions and the source can be disposed on a first side of the gate dielectric and the drain can be disposed on an opposing second side of the dielectric. Ends of the gate dielectric can be disposed on an isolation structure surrounding the one of the separate FET portions.

According to some embodiments of the present disclosure, a monolithic multi-FET transistor system comprises a first monolithic multi-FET transistor and a second monolithic multi-FET transistor. Each of the FETs of the first monolithic multi-FET transistor and each of the FETs of the second monolithic multi-FET transistor comprises a respective gate, a respective source, and a respective drain. The substrate of the first monolithic multi-FET transistor can be separate from the substrate of the second monolithic multi-FET transistor. The second monolithic multi-FET transistor can be non-native to the first monolithic multi-FET transistor (e.g., has been printed onto the first monolithic multi-FET transistor). According to some embodiments, one or more of (i) the respective sources of two of the FETs of the first monolithic multi-FET transistor are a common source, (ii) the respective drains of two of the FETs of the first monolithic multi-FET transistor are a common drain, (iii) the respective sources of two of the FETs of the second monolithic multi-FET transistor are a common source, and (iv) the respective drains of two of the FETs of the second monolithic multi-FET transistor are a common drain.

According to some embodiments of the present disclosure, a monolithic multi-FET transistor system comprises a monolithic multi-FET transistor, a multi-FET controller disposed on the monolithic multi-FET transistor, and one or more electrical conductors electrically connecting the multi-FET controller to the monolithic multi-FET transistor, the multi-FET controller operable to control the multi-FET transistor. The multi-FET controller can comprise a substrate comprising a semiconductor material that is different from a semiconductor material in the substrate of the monolithic multi-FET transistor. The semiconductor material in the substrate of the monolithic multi-FET transistor can be a semiconductor material of the epitaxial layer. The substrate of the monolithic multi-FET transistor can comprise a bulk semiconductor layer and the semiconductor material in the substrate of the monolithic multi-FET transistor can be a semiconductor material of a bulk semiconductor layer. The multi-FET controller can be non-native to the monolithic multi-FET transistor (e.g., has been printed onto the monolithic multi-FET transistor).

According to some embodiments of the present disclosure, a method of making a monolithic multi-FET transistor comprises providing a substrate comprising a single-crystalline semiconductor epitaxial layer, electrically isolating separate FET portions of the epitaxial layer, and forming a plurality of FETs on the substrate. Each of the plurality of FETs comprises one of the separate FET portions of the epitaxial layer. Electrically isolating the separate portions can comprise patterning a common isolation structure in the epitaxial layer. Each of the plurality of FETs can comprise a respective gate, a respective drain, and a respective source and at least one of (i) the respective drains of two of the plurality of FETs can be a common drain and (ii) the respective sources of two of the plurality of FETs can be a common source. Each of the plurality of FETs can comprise a respective gate, a respective drain, and a respective source. The method can further comprise electrically connecting the respective drain of each of the plurality of FETs together with a drain conductor, electrically connecting the respective source of each of the plurality of FETs together with a source conductor, and electrically connecting the respective gate of each of the plurality of FETs together with a gate conductor. Providing the substrate can comprise providing a substrate comprising an insulating (e.g., dielectric) layer and forming the epitaxial layer on the insulating layer. The substrate can be a silicon-on-insulator (SOT) substrate.

Embodiments of the present disclosure provide improved performance, improved semiconductor substrate utilization, and improved integration and reduced size.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1C is a plan view of a multi-FET structure corresponding to FIG. 1A according to embodiments of the present disclosure;

FIG. 2D is a plan view of multi-FET transistors with centerlines according to embodiments of the present disclosure;

Figure 1A:
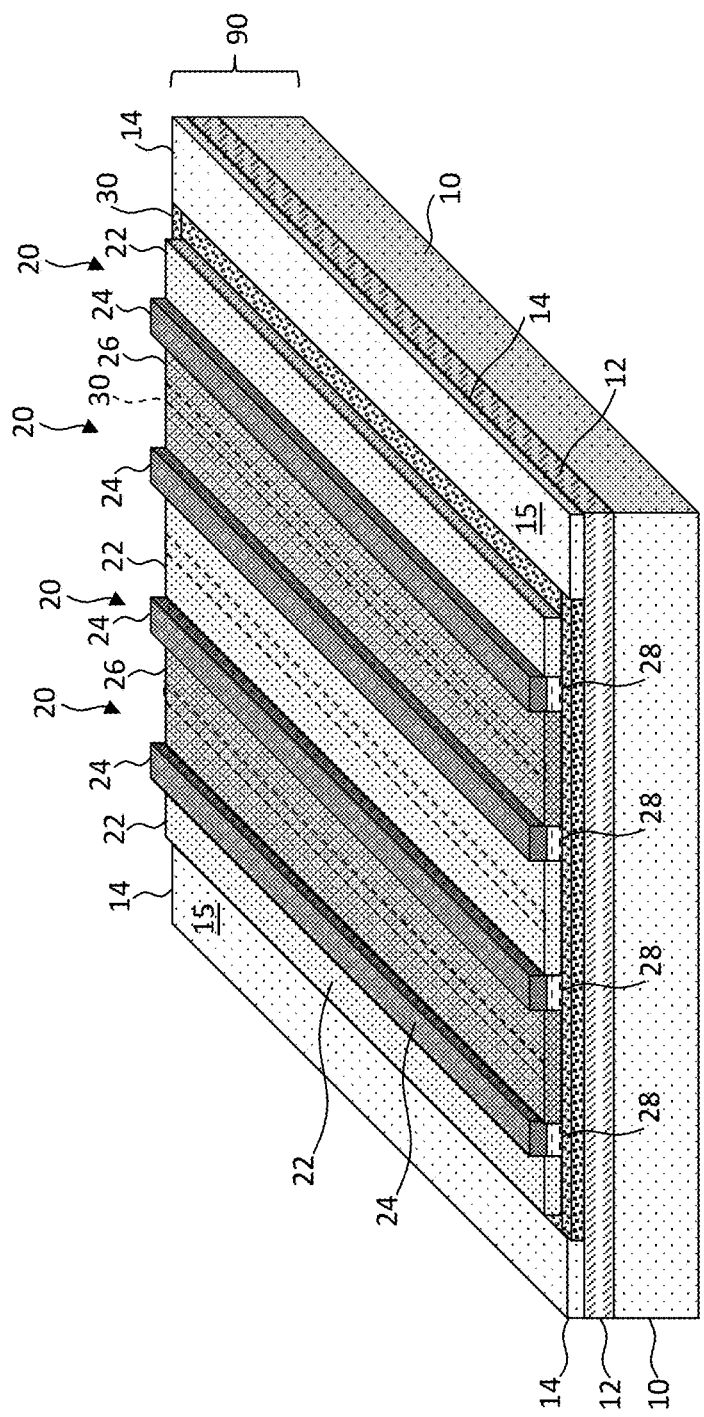
FIG. 1A is a perspective of a multi-FET structure according to embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Embodiments of the present disclosure provide, among other things, power transistor and power-conversion structures that provide improved performance with a reduced size in electronic systems. According to some embodiments, pairs of neighboring (adjacent) electrically connected field-effect transistors (FETs) are provided in a single monolithic substrate and each pair of adjacent FETs share source epitaxial areas, or drain epitaxial areas, or both in a semiconductor-on-insulator (SOI) substrate. A monolithic multi-FET transistor according to embodiments has improved density by reducing packaging structure size and semiconductor area (e.g., dicing area) and improved performance by reducing the resistance of the multi-FET transistor structure, increasing efficiency and decreasing wasteful heating.

Figure 1B:
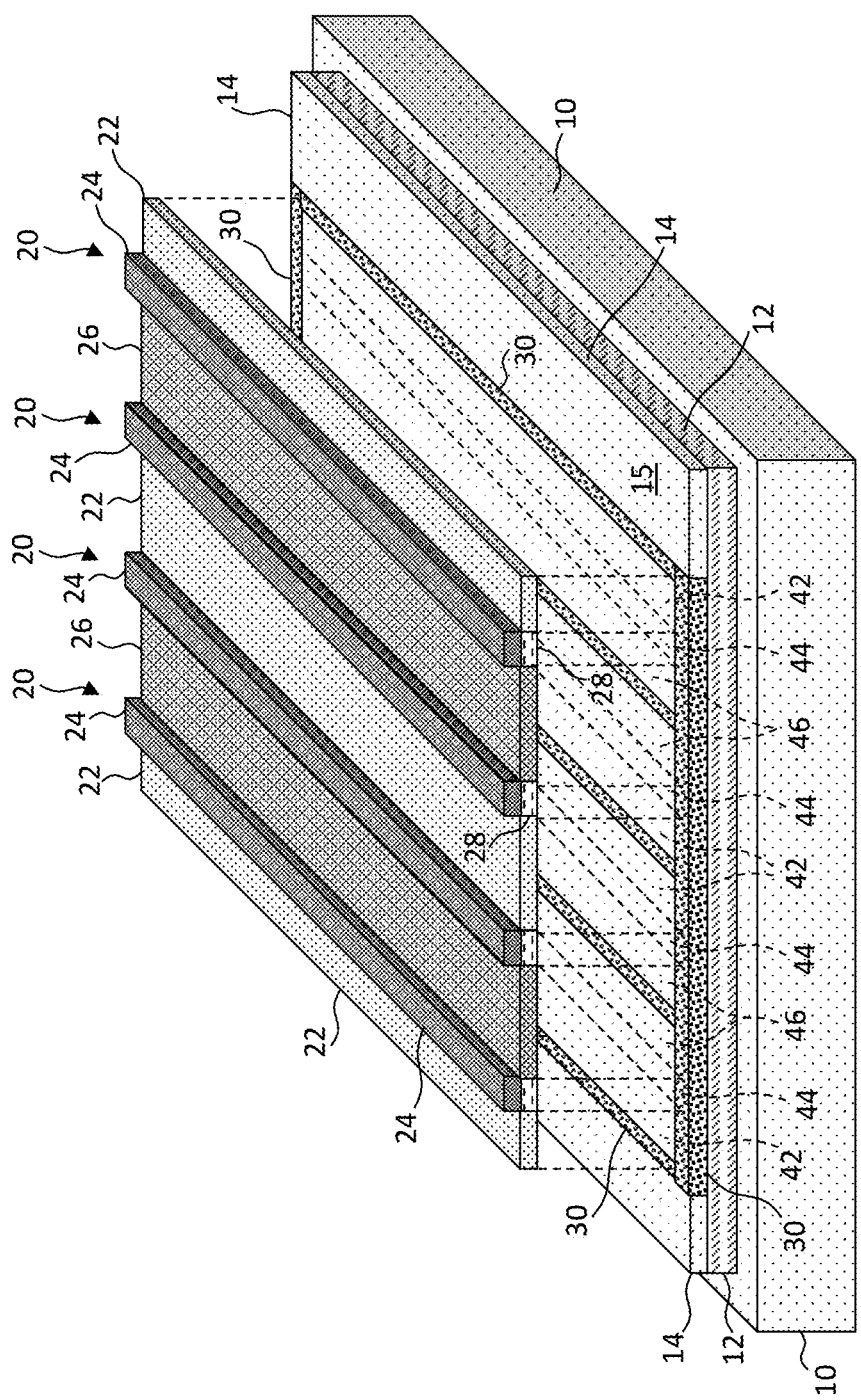
FIG. 1B is an exploded cut-away perspective of a multi-FET structure corresponding to FIG. 1A according to embodiments of the present disclosure.
Figure 1D:
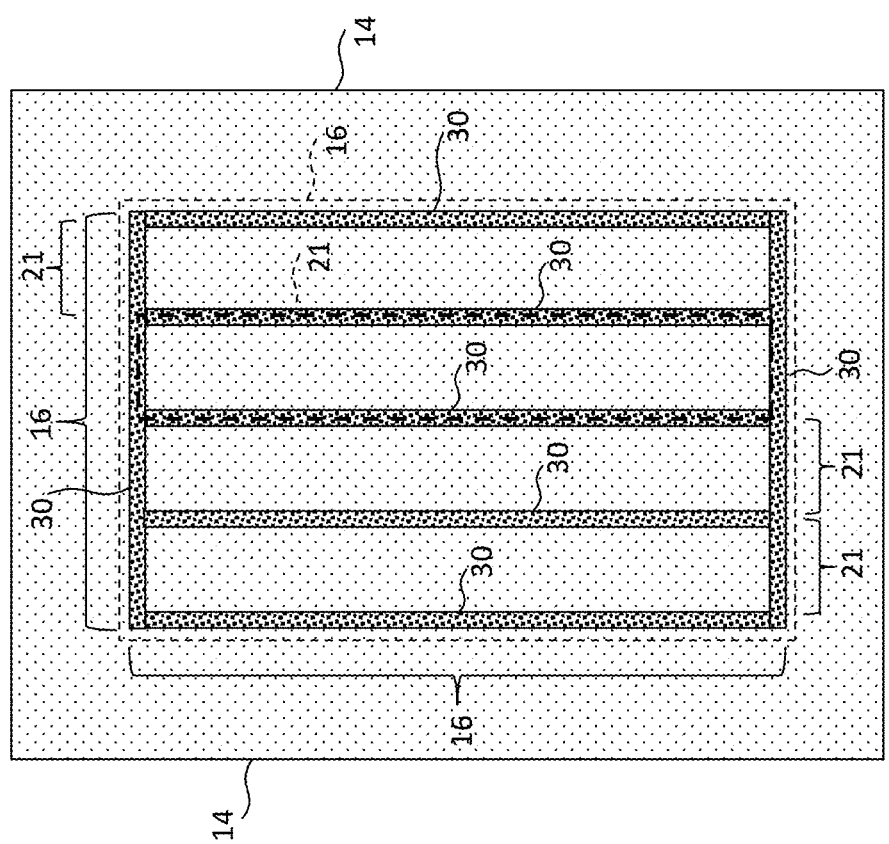
FIGS. 1D and 1E are partial plan views of a multi-FET structure corresponding to FIG. 1A according to embodiments of the present disclosure.
Figure 1E:
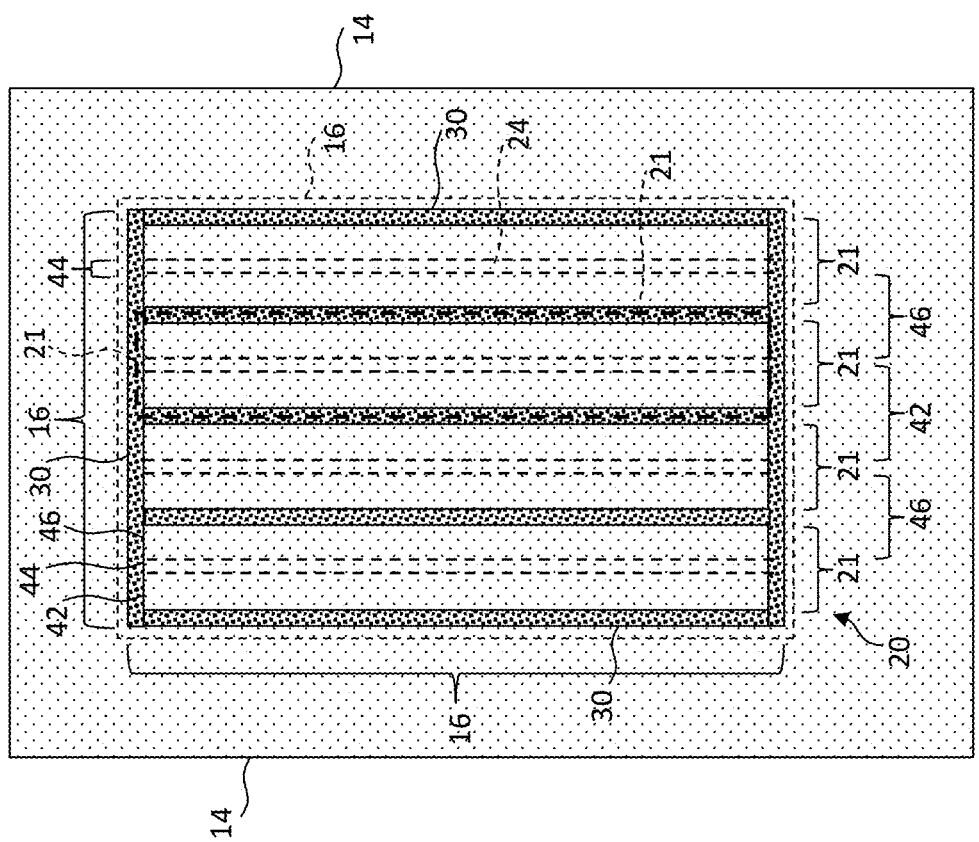
Figure 1F:
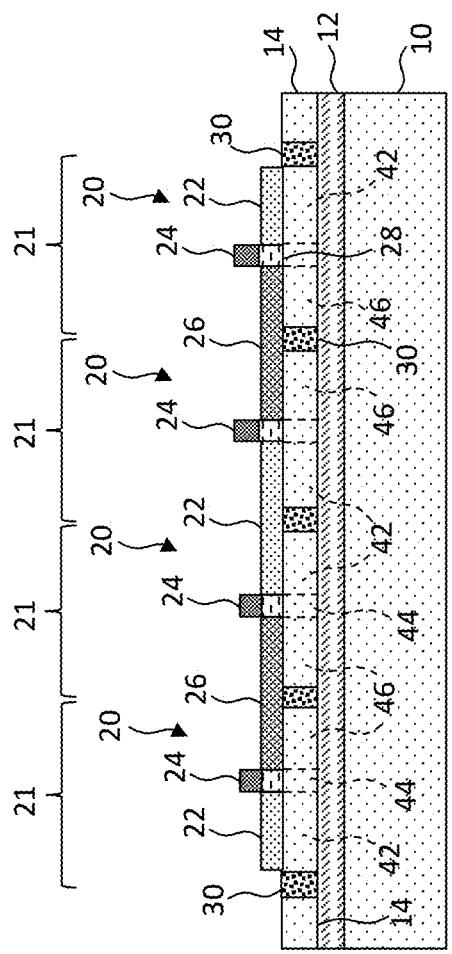
FIG. 1F is a cross section of a multi-FET structure corresponding to cross section line A of FIG. 1C according to embodiments of the present disclosure.

According to some embodiments of the present disclosure and as illustrated in FIGS. 1A-1E, a monolithic multi-FET transistor 99 (for example a power transistor) comprises a semiconductor substrate 90 comprising a bulk layer 10 of semiconductor material, a dielectric layer 12 (e.g., an insulating layer 12 such as a buried oxide layer) disposed on (e.g., directly on) bulk layer 10, and an epitaxial layer 14 of semiconductor material disposed on dielectric layer 12. Semiconductor substrate 90 can be a silicon-on-insulator (SOI) semiconductor substrate 90 or SOI semiconductor substrate. Bulk layer 10 and epitaxial layer 14 can both comprise a crystalline semiconductor material, for example each can be a single crystal. The crystalline semiconductor material of bulk layer 10 can be the same as the crystalline semiconductor material of epitaxial layer 14 (e.g., silicon) or different (e.g., a silicon bulk layer 10 and a compound semiconductor epitaxial layer 14). Epitaxial layer 14 can be formed by any suitable epitaxial process, including, but not limited to, certain chemical vapor deposition methods, atomic vapor deposition methods, and molecular beam epitaxy methods. Epitaxial layer 14 can comprise a multi-FET area 16 (e.g., as shown in FIG. 1D). FIG. 1E illustrates common source 22 and common drain 26 epitaxial portions of epitaxial layer 14 overlapping neighboring FET portions 21. Neighboring FET portions 21 are FET portions 21 between which there are no other FET portions 21.

An isolation structure 30 is disposed in epitaxial layer 14 so that epitaxial layer 14 is a patterned epitaxial layer 14. Isolation structure 30 can comprise a patterned dielectric structure, for example silicon dioxide, that is electrically insulating and extends from dielectric layer 12 through epitaxial layer 14 to an epitaxial layer surface 15 of epitaxial layer 14 opposite dielectric layer 12. Isolation structure 30 can surround multi-FET area 16 and divides multi-FET area 16 into electrically separate FET portions 21. Isolation structure 30 can be formed in and pattern epitaxial layer 14 using photolithographic methods and materials, for example including sputtering or evaporative deposition, photoresist masking, exposure patterning, and etching. For example, epitaxial layer 14 can be patterned in the pattern of isolation structure 30 by pattern-wise etching epitaxial layer 14 through a patterned photoresist mask, dielectric material deposited over the etched pattern, and dielectric material removed from the FET portions 21 of epitaxial layer 14. Isolation structure 30 can provide deep-trench isolation between electrically separate FET portions 21, mitigating any electrical current conduction or electromagnetic field coupling between FET portions 21.

Gate dielectrics 28 each extend over only a part of each different FET portion 21 and each contacts isolation structure 30 at two separated locations. Gate dielectrics 28 can be gate oxides (e.g., a thin layer of silicon dioxide) formed by photolithography. A gate 24 is disposed on each gate dielectric 28, a source 22 is disposed on epitaxial layer 14 within each FET portion 21 on a side of gate 24 and gate dielectric 28, and a drain 26 is disposed on epitaxial layer 14 within each FET portion 21 on a side of gate 24 and gate dielectric 28 opposite source 22. Each gate 24, source 22, and drain 26 comprise a separate patterned electrical conductor (e.g., a patterned metal). Gate 24, source 22, and drain 26 can be a gate terminal, a source terminal, and a drain terminal, respectively (collectively terminals), and together with epitaxial layer 14 within each FET portion 21 form a field-effect transistor (FET) 20. Parts of epitaxial layer 14 within each FET portion 21 (for example between source 22 and dielectric layer 12 and between drain 26 and dielectric layer 12) can be doped to control the conductivity of the epitaxial semiconductor material. The epitaxial layer 14 beneath gate 24 can be channel epitaxy 44, the epitaxial layer 14 beneath source 22 can be source epitaxy 42, and the epitaxial layer 14 beneath drain 26 can be drain epitaxy 46, as shown in FIG. 1B. For example, doping of epitaxial layer 14 can vary over an area to define portions corresponding to source 22, gate 24, and drain 26.

At least sources 22 of two neighboring FET portions 21 (and two neighboring FETS 20) are a common source 22 disposed over at least a portion of isolation structure 30 dividing the two neighboring FET portions 21 or drains 26 of two neighboring FET portions 21 are a common drain 26 disposed over at least a portion of the isolation structure 30 dividing the two neighboring FET portions 21. Thus, in some embodiments, each FET portion 21 comprises an FET and neighboring FET portions 21 share a common source 22 or a common drain 26. By providing shared sources 22 or drains 26, or both, monolithic multi-FET transistor 99 is smaller and more highly integrated, for example compared to serpentine transistors that separate different source and drain portions of a single transistor with dielectric isolation structures. Monolithic multi-FET transistor 99 embodiments of the present disclosure can have less area dedicated to dielectric structures than other transistor designs having an equivalent gate length.

Monolithic multi-FET transistors 99 are monolithic because, in various embodiments, multi-FET area 16 comprises one or more of (i) a single, crystalline semiconductor substrate 90, (ii) a common bulk layer 10, and (iii) a common dielectric layer 12, and/or has multiple FET portions 21 formed from a single, common crystal semiconductor structure (epitaxial layer 14) separated or divided by isolation structure 30.

Figure 2A:
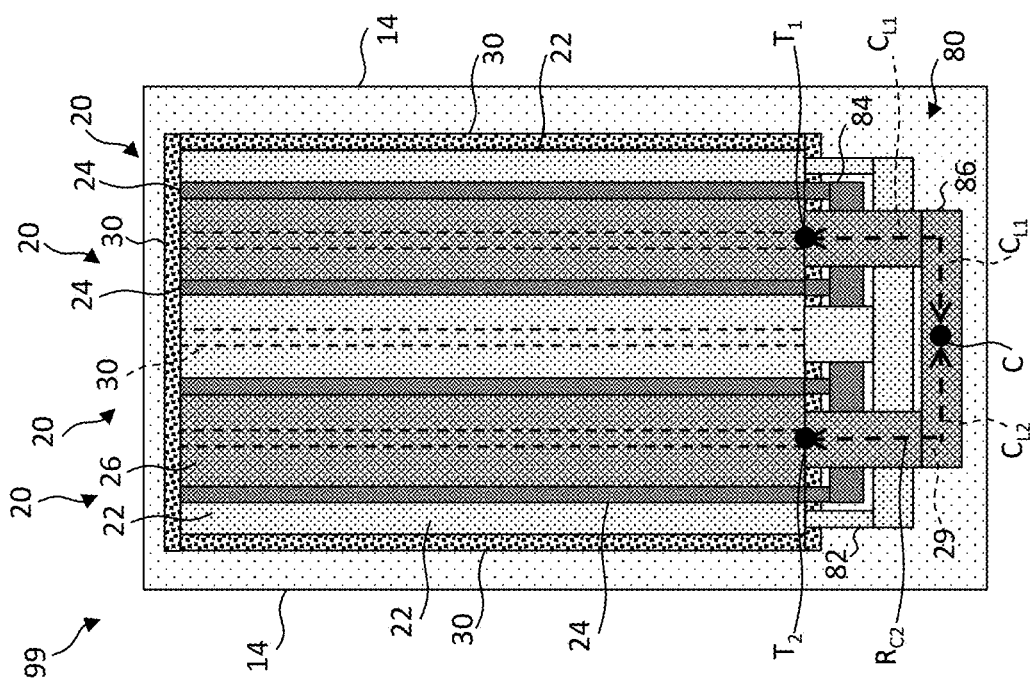
FIG. 2A is a plan view of multi-FET transistors with contacts according to embodiments of the present disclosure.
Figure 2B:
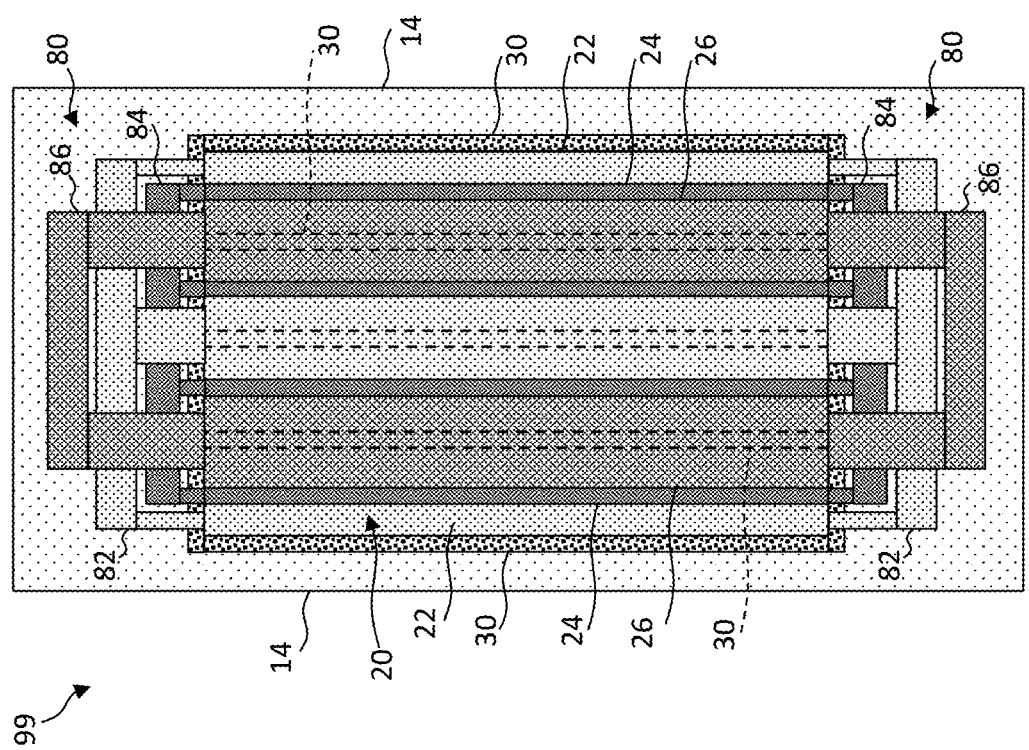
FIG. 2B is a plan view of multi-FET transistors with contacts according to embodiments of the present disclosure.
Figure 2C:
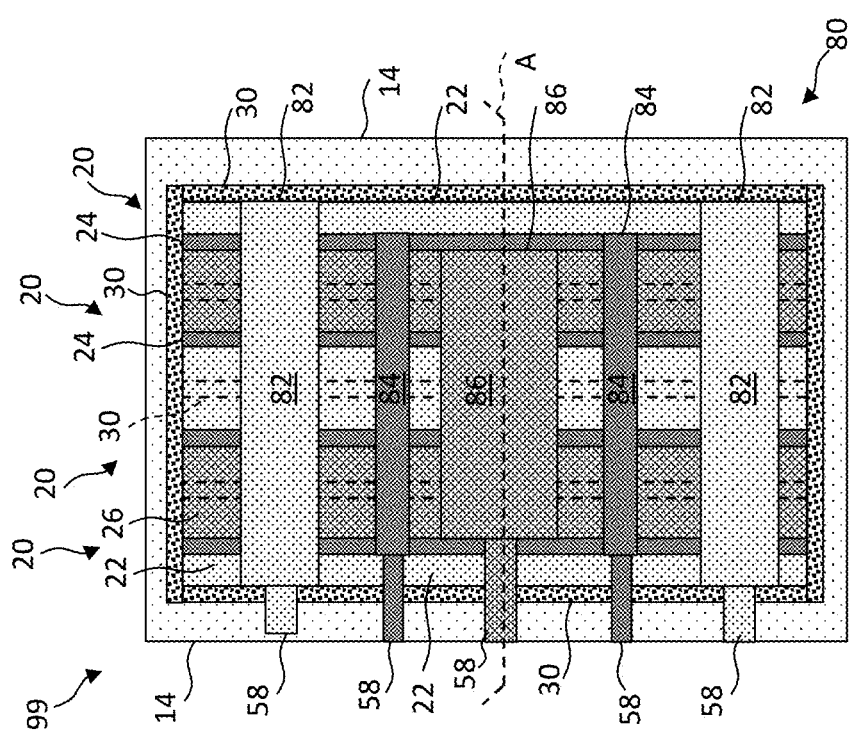
FIG. 2C is a plan view of multi-FET transistors with contacts according to embodiments of the present disclosure.
Figure 3:
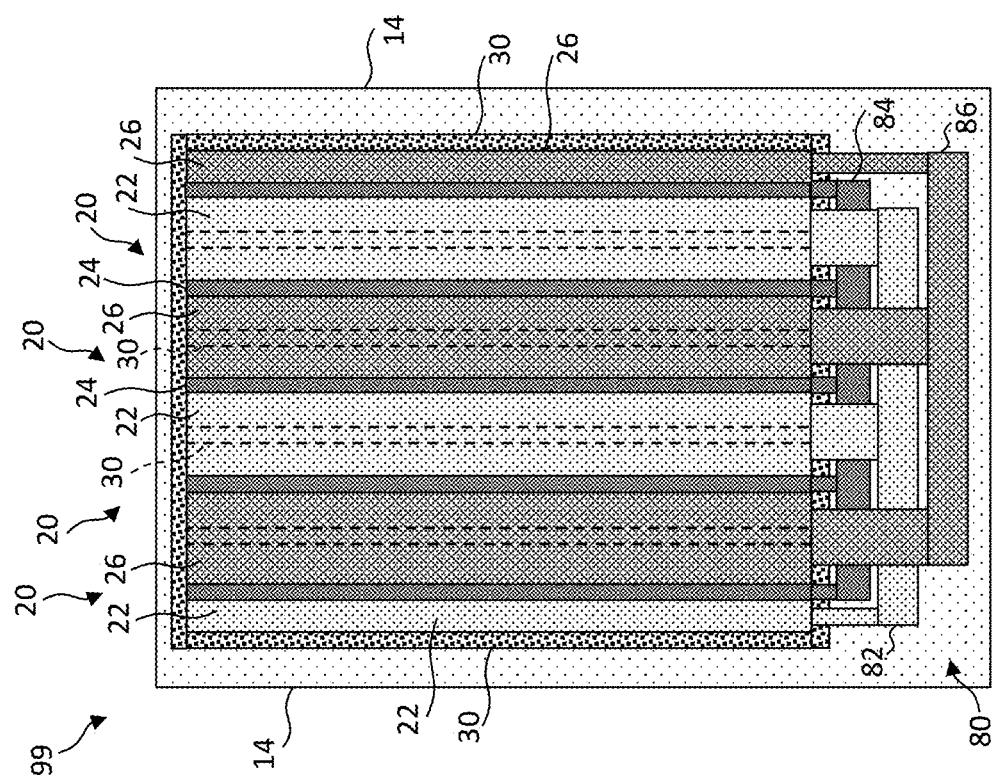
FIG. 3 is a plan view of multi-FET transistors according to embodiments of the present disclosure.

In some embodiments and as illustrated in monolithic multi-FET 99 embodiments of FIGS. 2A, 2B, and 3, gate contact 84 can electrically connect all gates 24 of separate FET portions 21, a source contact 82 can electrically connect all sources 22 of separate FET portions 21, and a drain contact 86 can electrically connect all drains 26 of FET portions 21. Gate contacts 84, source contacts 82, and drain contacts 86 are collectively referred to as contacts 80. For clarity of illustration, FIGS. 1A-1E do not show contacts 80 though one of ordinary skill will understand that they could be added. By making electrical connections and providing control signals to source contact 82, gate contact 84, and drain contact 86, FETs 20 of monolithic multi-FET 99 can be operated. Source contact 82, gate contact 84, and drain contact 86 can be electrically connected at any point of source 22, gate 24, and drain 26, respectively, but according to some embodiments and as shown in FIG. 2A, each gate 24 has a gate end and the gate ends are electrically connected with gate contact 84, each source 22 has a source end and the source ends are electrically connected with source contact 82, or each drain 26 has a drain end and the drain ends are electrically connected with drain contact 86. As illustrated in the embodiments of FIG. 2B, each gate 24 has two opposing gate ends and the gate ends are electrically connected with gate contact 84, each source 22 has a two opposing source ends and the source ends are electrically connected with source contact 82, each drain 26 has two opposing drain ends and the drain ends are electrically connected with drain contact 86. The gate contacts 84 at opposing ends of monolithic multi-FET 99 can be electrically connected, the source contacts 82 at opposing ends of monolithic multi-FET 99 can be electrically connected, and the drain contacts 86 at opposing ends of monolithic multi-FET 99 can be electrically connected. By electrically connecting both ends of source 22, gate 24, and drain 26, additional current can be provided to, and additional heat removed from, source 22, gate 24, drain 26, source epitaxy 42, channel epitaxy 44, and drain epitaxy 86. In some embodiments, source contact 82, gate contact 84, and drain contact 86 are at least partially disposed directly over any one or more of source 22, gate 24, and drain 26, on a side of the gate 24, source 22, and drain 26, for example opposite epitaxial layer 14 in a direction orthogonal to epitaxial layer surface 15, as is shown in FIG. 2C. Source contact 82, gate contact 84, and drain contact 86 can be electrically insulated from source 22, gate 24, and drain 26 by intervening dielectric layers over epitaxial layer 14, such as silicon dioxide or silicon nitride layers, and electrically connected through vias in the dielectric layers.

External electrical connection can be made to any suitable portion of source contact 82, gate contact 84, and drain contact 86.

In general, the number of FETs 20 and FET portions 21 can be chosen at any desired number in monolithic multi-FET transistor 99, limited only by the resolution of the photolithographic processes used to pattern gates 24, sources 22, drains 26, and isolation structure 30 and to dope suitable portions of FET portions 21. In some embodiments, monolithic multi-FET transistor 99 comprises a single common source 22 or a single common drain 26. In some embodiments, monolithic multi-FET transistor 99 comprises multiple common sources 22, multiple common drains 26, or both. Additional FET portions 21 can be constructed in epitaxial layer 14 and multi-FET area 16 defining alternating sources 22 and drains 26 forming FETs 20 over monolithic multi-FET transistor 99. As shown in the illustration of FIG. 3, according to some embodiments monolithic multi-FET transistor 99 comprises three or more separate FET portions 21, for example four, five, or six portions 21, and at least sources 22 of two neighboring FET portions 21 are a common source 22 disposed over isolation structure 30 separating or dividing the two neighboring FET portions 21 and drains 26 of two neighboring FET portions 21 are a common drain 26 disposed over isolation structure 30 separating or dividing the two neighboring FET portions 21.

Figure 4:
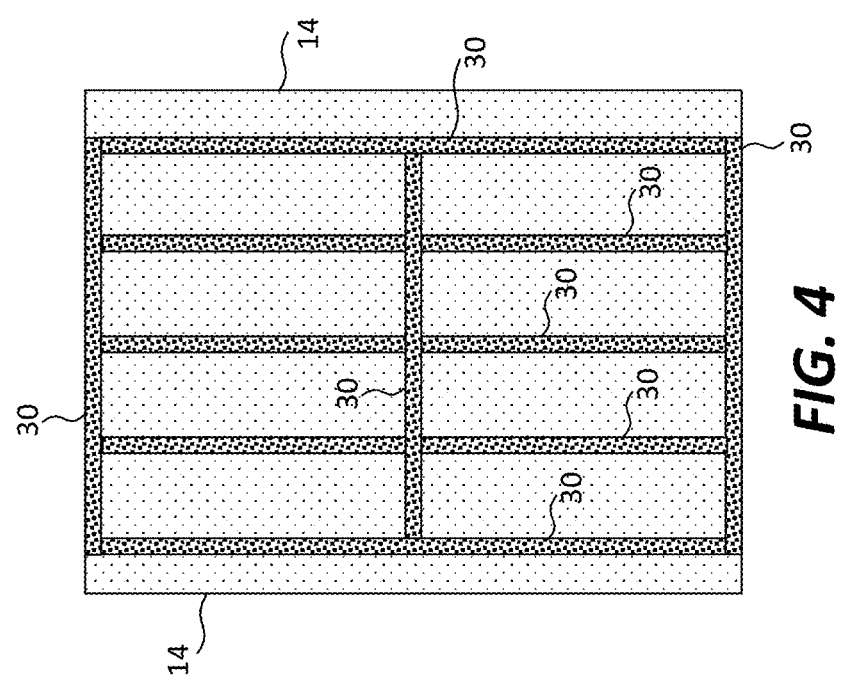
FIG. 4 is a partial plan view of a two-dimensional multi-FET structure according to embodiments of the present disclosure.

According to embodiments of the present disclosure and as illustrated in FIGS. 1A-3, isolation structure 30 divides or separates multi-FET area 16 into a one-dimensional array of separate FET portions 21. As shown in FIG. 4 and according to some embodiments, isolation structure 30 divides or separates multi-FET area 16 into a two-dimensional array of separate FET portions 21. FETs 20 can be formed over each separate FET portion 21 in the two-dimensional array, for example sharing one or more common sources 22, one or more common drains 26, or both in either dimension of the array. Thus, according to some embodiments, two neighboring FET portions 21 are first neighboring FET portions 21 adjacent in a first dimension and two other neighboring FET portions 21 in a second dimension different from the first dimension are second neighboring FET portions 21 and gates 24 of the second neighboring FET portions 21 are a common gate 24 disposed over isolation structure 30 dividing the two second neighboring FET portions 21, sources 22 of the second neighboring FET portions 21 are a common source 22 disposed over isolation structure 30 dividing the two second neighboring FET portions 21, and the drains 26 of the second neighboring FET portions 21 are a common drain 26 disposed over isolation structure 30 dividing the two second neighboring FET portions 21.

According to embodiments of the present disclosure and as shown in FIGS. 1-4, gate 24, source 22, and drain 26 are linear, as are the portions under epitaxial layer 14 beneath each of them. By linear is meant that a centerline 29 (as shown in FIG. 4) equidistant from either edge along the length of the structure gate 24, source 22 and drain 26 is linear, in a straight line. Thus, gate 24, source 22, and drain 26 can be rectangular structures having a length greater than a width.

According to some embodiments of the present disclosure, gate contact 84 is more electrically conductive than gate 24, source contact 82 is more electrically conductive than source 22, or drain contact 86 is more electrically conductive than drain 26, or any combination of these. More conductive contacts 80 can be provided using more electrically conductive materials, a wider wire or trace, a thicker wire or trace, or materials having a different structure (e.g., annealed or otherwise processed to improve electrical conductivity) than are found in the source 22, gate 24, or drain 26. By providing contacts 80 with lower resistance than any one or more of source 22, gate 24, or drain 26, resistive losses are reduced. In particular, monolithic multi-FET transistor 99 embodiments of the present disclosure provide an advantage over serpentine transistor having the same aggregate gate length (including the gate lengths of all of gates 24 in monolithic multi-FET 99) as monolithic multi-FET transistor 99, since the total distance that current must travel along the entire length of gate 24, source 22, and drain 26 at a relatively higher resistance in a serpentine transistor is reduced in monolithic multi-FET transistor 99 according to embodiments of the present disclosure. By resistance is meant the resistance along the length of gate 24, gate contact 84, source 22, source contact 82, drain 26, and drain contact 86, e.g., where the length is the length of the respective centerline 29 (for example as shown in FIGS. 2A, 2D). According to embodiments of the present disclosure, many short FETs 20 electrically connected with more-conductive contacts 80 provide superior performance with reduced resistance and greater density when integrated into monolithic multi-FET transistor 99.

According to embodiments of the present disclosure and as illustrated in FIGS. 2A, 2D, a resistance $R_C$ of any one of the contacts 80 (e.g., source contact 82, gate contact 84, and drain contact 86) is less than the difference between a resistance $R_T$ of the terminals of the monolithic multi-FET transistor 99 (e.g., gate 24, source 22, and drain 26, respectively) having a length L and the resistance $R_E$ of an FET transistor comprising equivalent materials with a gate 24, source 22, and drain 26 of equivalent length M×L, M being the number of FETs 20 in monolithic multi-FET transistor 99. The resistance of the terminals $R_T$ for the monolithic multi-FET 99 having M FETs 20 can be the integral of the terminal lengths from a contact 80 times a resistance constant k or $(k/2)L^2$ and the resistance $R_E$ of the equivalent-length FET is $(k/2)(ML)^2$. The resistance of each contact $R_C$ is the sum of the resistances of the connection lengths of the contact portions from an external connection C to the terminal connections (e.g., resistance of connection length $C_{L1}$ from connection point C to terminal connection $T_1$+resistance of connection length $C_{L2}$ from connection point C to terminal connection $T_2$ of FIG. 2A). Thus, in some embodiments $R_C<(R_E-R_T)$. If multiple gate contacts 80 for any of gate, source, or drain contacts 84, 82, 86 is provided to reduce the net length of gate 24, source 22, and drain 26 from a contact 80 (e.g., as in FIG. 2B wherein the lengths of gate 24, source 22, and drain 26 from contacts 80 are one half that of the structure in FIG. 1A), the resistance of each are calculated independent and then added.

Figure 5A:
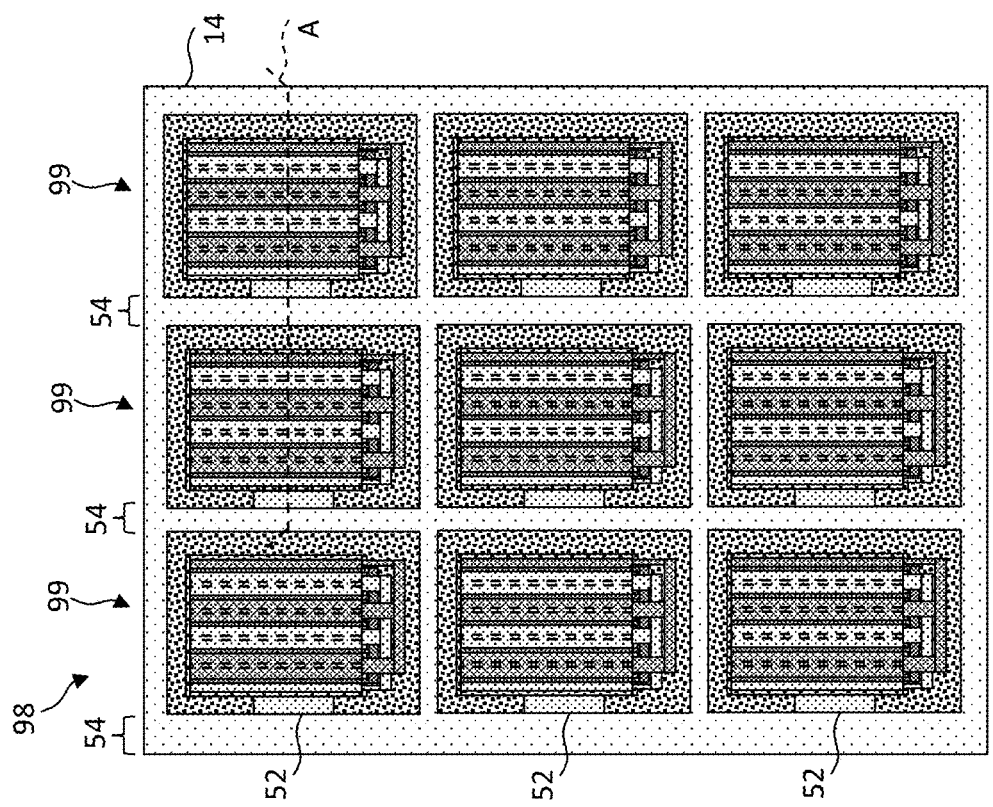
FIG. 5A is a plan view of a multi-FET wafer according to embodiments of the present disclosure.
Figure 5B:
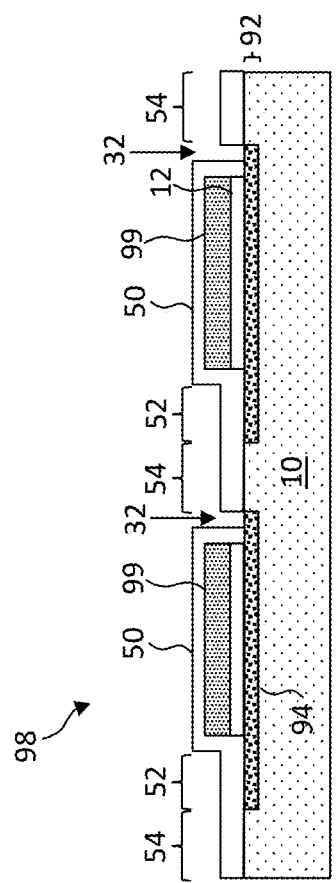
FIG. 5B is a cross section of a multi-FET wafer corresponding to cross section line A of FIG. 5A according to embodiments of the present disclosure.

In embodiments of the present disclosure and as illustrated in FIGS. 5A and 5B, epitaxial layer 14 of a monolithic multi-FET wafer 98 comprises multiple, separate multi-FET areas 16. Isolation structure 30 surrounds each multi-FET area 16 areas and divides each multi-FET area 16 into separate FET portions 21, forming a separate patterned monolithic multi-FET transistor 99 for each multi-FET area 16. Hence, a single monolithic multi-FET wafer 98 can comprise a plurality of patterned monolithic multi-FET transistors 99. Bulk layer 10 can comprise a patterned sacrificial layer 92 comprising sacrificial portions 94 separated by anchors 54 (e.g., anchor portions of patterned sacrificial layer 92). Sacrificial portions 94 can be a designated portion of an anisotropically etchable crystal, such as a crystalline semiconductor or a crystalline compound semiconductor, a portion that is differentially etchable (e.g., anisotropically etchable) from bulk layer 10 and dielectric layer 12, or a gap between bulk layer 10 and dielectric layer 12 (e.g., after etching the differentially etchable portion(s)).

Each monolithic multi-FET transistor 99 is completely and entirely disposed over, e.g., directly over, a sacrificial portion 94 and physically connected to an anchor 54 by a multi-FET tether 52, for example constructed from a patterned encapsulation layer 50. A patterned encapsulation layer 50 can comprise a dielectric material such as silicon dioxide deposited and patterned using photolithographic methods and materials, leaving a portion of sacrificial portion 94 exposed. When etched, the sacrificial portion 94 becomes a gap leaving monolithic multi-FET transistor 99 suspended over bulk layer 10. Thus, each monolithic multi-FET transistor 99 can be a monolithic micro-transfer printable monolithic multi-FET transistor 99.

Figure 5C:
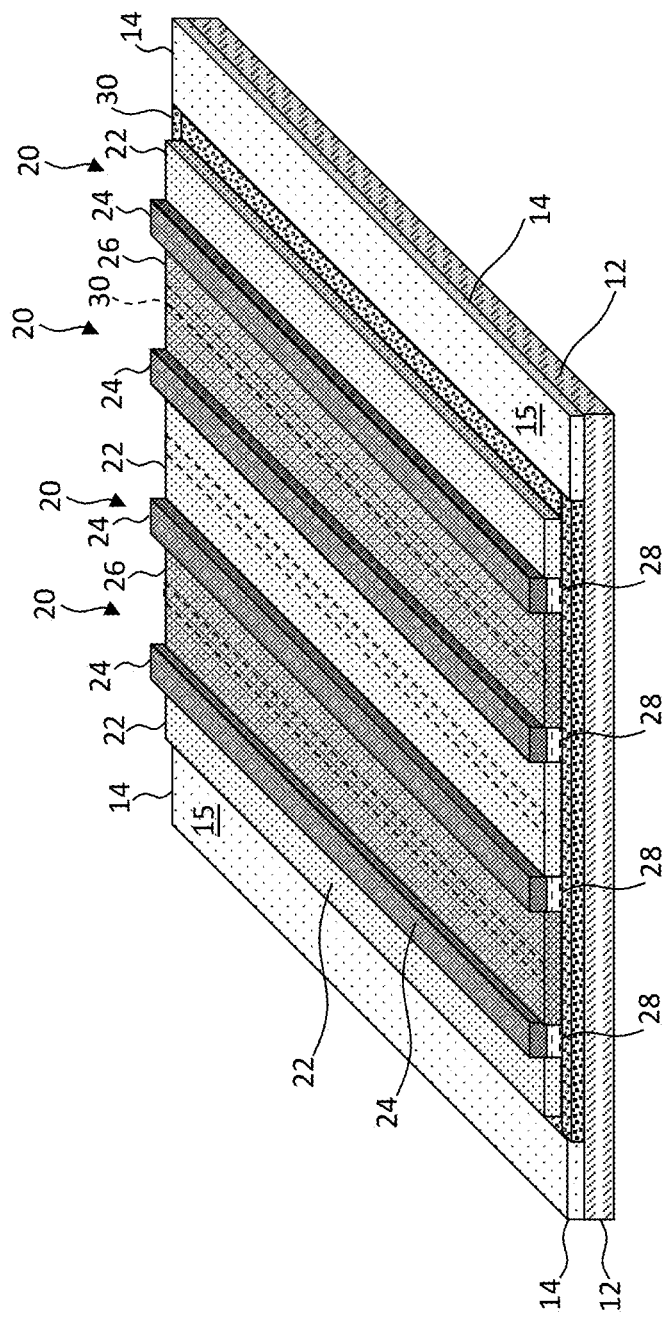
FIG. 5C is a perspective detail of FIG. 5B illustrating a multi-FET transistor without a bulk layer according to embodiments of the present disclosure.

When sacrificial portion 94 is etched, dielectric layer 12 is detached from bulk layer 10. Thus, in some embodiments of the present disclosure and as illustrated in the perspective of FIG. 5C and the cross section of FIG. 5D (excluding gate, source, and drain contacts 84, 82, 86 and otherwise corresponding to FIG. 1F), a micro-transfer-printable or micro-transfer-printed monolithic multi-FET transistor 99 can exclude bulk layer 10. Such a monolithic multi-FET transistor 99 can comprise a dielectric layer 12 and an epitaxial layer 14 disposed on dielectric layer 12, epitaxial layer 14 comprising a crystalline semiconductor material and a multi-FET area 16. An isolation structure 30 is disposed in epitaxial layer 14 and extends from dielectric layer 12 through epitaxial layer 14 to epitaxial layer surface 15 of epitaxial layer 14 opposite dielectric layer 12. Isolation structure 30 surrounds multi-FET area 16 and divides multi-FET area 16 into separate FET portions 21. Gate dielectrics 28 each extend over only a part of a different FET portion 21 and each contact isolation structure 30 at two separated locations. A gate 24 is disposed on each gate dielectric 28, a source 22 is disposed on epitaxial layer 14 within each FET portion 21 on a side of gate 24. A drain 26 is disposed on epitaxial layer 14 within each FET portion 21 on a side of gate 24 and gate dielectric 28 opposite source 22. Each gate 24, source 22, and drain 26 comprise a separate electrical conductor and the gate 24, source 22, drain 26, and epitaxial layer 14 within each FET portion 21 form a field-effect transistor 20. A gate contact 84 electrically connects all of gates 24 of the separate FET portions 21, a source contact 82 electrically connects all of sources 22 of the separate FET portions 21, and a drain contact 86 electrically connects all of drains 26 of the FET portions 21. At least sources 22 of two neighboring FET portions 21 are a common source 22 disposed over at least a portion of isolation structure 30 dividing the two neighboring FET portions 21 or drains 26 of two neighboring FET portions 21 are a common drain 26 disposed over at least a portion of isolation structure 30 dividing two neighboring FET portions 21. The attributes of monolithic multi-FET transistors 99 comprising bulk layer 10 as illustrated in FIG. 1 and described above can also be attributes of monolithic multi-FET transistors 99 that exclude bulk layer 10.

Figure 6:
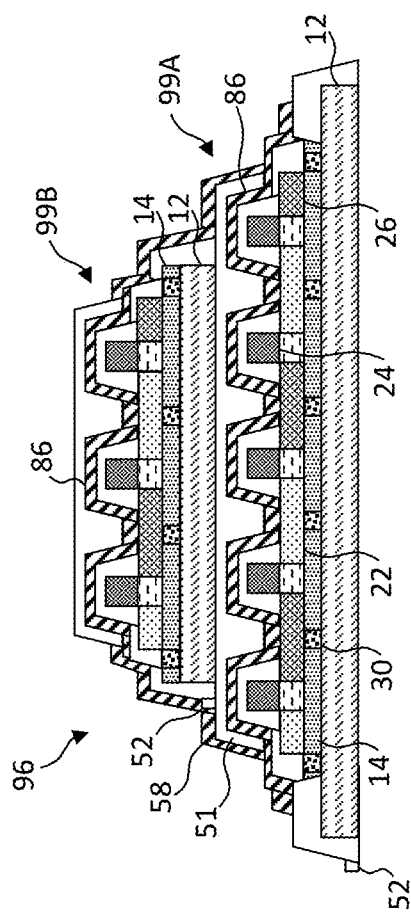
FIG. 6 is a cross section of a multi-FET system according to embodiments of the present disclosure.

Monolithic multi-FET transistors 99 can be electrically connected in a monolithic multi-FET system 96. As shown in the embodiments of the cross section of FIG. 6 (taken across cross section line A of FIG. 2C and with reference to FIG. 2C), a monolithic multi-FET system 96 comprises a first monolithic multi-FET transistor 99A and a second monolithic multi-FET transistor 99B. Second monolithic multi-FET transistor 99B can be printed (e.g., micro-transfer printed) onto and disposed on or over first monolithic multi-FET transistor 99A, for example onto a dielectric layer (e.g., encapsulation layer 50) of first monolithic multi-FET transistor 99A. An electrical conductor 58 electrically connects gate contact 84 of first monolithic multi-FET transistor 99A to gate contact 84 of second monolithic multi-FET transistor 99B, an electrical conductor 58 electrically connects source contact 82 of first monolithic multi-FET transistor 99A to source contact 82 of second monolithic multi-FET transistor 99B, and an electrical conductor 58 electrically connects drain contact 86 of first monolithic multi-FET transistor 99A to drain contact 86 of second monolithic multi-FET transistor 99B, so that first monolithic multi-FET transistor 99A and second monolithic multi-FET transistor 99B are electrically connected in parallel. According to some embodiments and as shown in FIG. 6, first monolithic multi-FET transistor 99A has a first area and second monolithic multi-FET transistor 99B has a second area, and the first area is greater than the second area. The first and second areas can be the extent of first and second monolithic multi-FETs 99A, 99B, respectively over or parallel to epitaxial layer surface 15 (e.g., an extent of, over, or parallel to a surface of bulk layer 10). The second area can be no greater than 90% of the first area (e.g., no greater than 80%, 70%, 60%, 05%, 40%, 30%, 20%, or 10%) or larger.

According to some embodiments and as also shown in FIG. 6, first monolithic multi-FET transistor 99A has a first number of FETs and second monolithic multi-FET transistor 99B has a second number of FETs, and the first number is greater than the second number. For example, as shown in FIG. 6, first monolithic multi-FET transistor 99A has five FETs and second monolithic multi-FET transistor 99A has three FETs (the number of FETs is equivalent to the number of gates 24). By disposing monolithic multi-FETs 99 in a stack, monolithic multi-FET system 96 has increased density and a smaller footprint. Second monolithic multi-FET transistor 99B can be disposed entirely within an area of first monolithic multi-FET transistor 99A in one or two dimensions, as in a tiered cake. By stacking relatively and successively smaller monolithic multi-FETs 99 onto relatively larger monolithic multi-FETs 99, electrically interconnecting monolithic multi-FETs 99 in parallel is easier requiring fewer processing steps and the interconnecting electrical conductors 58 more robust since a stack with levels at increasing height and decreasing area has a reduced number and step height for vertical surfaces.

FIG. 6 illustrates two stacked monolithic multi-FETs 99, but according to embodiments of the present disclosure, three, four, or more monolithic multi-FETs 99 can be stacked. Moreover, different monolithic multi-FETs 99 can comprise different materials, can employ different processing methods and conditions, and can have different resolutions. Different monolithic multi-FETs 99 can have different areas in either one or two dimensions, can have different size FETs 20, or can have different size source epitaxy 42, channel epitaxy 44, or drain epitaxy 46.

Figure 7:
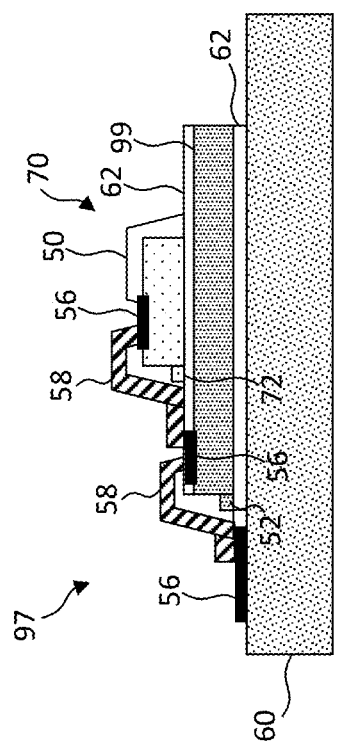
FIG. 7 is a cross section of a multi-FET system according to embodiments of the present disclosure.

According to embodiments of the present disclosure and as illustrated in FIG. 7, a multi-FET controller 70 (controller 70) for a monolithic multi-FET 99 in a monolithic multi-FET system 97 can be disposed, for example by printing (e.g., micro-transfer printing) controller 70 onto a monolithic multi-FET 99 and electrically connecting controller 70 to monolithic multi-FET 99 with electrical conductors 58 (electrodes 58). Controller 70 can control monolithic multi-FET 99 and can have a smaller area than monolithic multi-FET 99, for example an area of bulk semiconductor parallel to epitaxial layer surface 15. By disposing controller 70 on or over monolithic multi-FETs 99 in a stack, monolithic multi-FET system 97 has increased density and a smaller footprint. By stacking a relatively smaller controller 70 onto a relatively larger monolithic multi-FET 99, electrically interconnecting controller 70 to monolithic multi-FETs 99 is easier and the interconnecting electrical conductors 58 more robust since a stack with levels at increasing height and decreasing area has a reduced number and step height for vertical surfaces.

According to some embodiments, controller 70 is printed (e.g., micro-transfer printed) from a controller source wafer onto or over monolithic multi-FET 99, for example onto an electrically insulating dielectric layer (e.g., encapsulation layer 50), and can comprise a broken (e.g., fractured) or separated controller tether 72 as a consequence of a micro-transfer printing method used to print. A layer of adhesive 62 can be disposed between controller 70 and monolithic multi-FET 99 to adhere controller 70 to monolithic multi-FET. By micro-transfer printing, as an example, controller 70 can be integrated with monolithic multi-FET 99 as a bare, unpackaged die disposed on a bare unpackaged die in a relatively small and highly integrated monolithic multi-FET system 97. Furthermore, by printing (e.g., micro-transfer printing) controller 70 onto monolithic multi-FET 99, controller 70 can comprise a different material from a material of monolithic multi-FET 99, so that each of controller 70 and monolithic multi-FET 99 can comprise a material chosen to provide the best performance for their respective functions. Thus, controller 70 can comprise a semiconductor material that is different from the crystalline semiconductor material of the epitaxial layer 14, e.g., comprising different materials or subject to different process conditions. According to some embodiments, monolithic multi-FET 99 is smaller than multi-FET controller 70 and is disposed on multi-FET controller 70, for example by micro-transfer printing. Monolithic multi-FET system 97 can be printed (e.g., micro-transfer printed) onto a target substrate 60, for example onto a layer of adhesive 62 disposed on target substrate 60. Target substrate 60 can be a glass, polymer, quartz, ceramic, or semiconductor substrate, for example as are found in the display and printed-circuit board industries. Monolithic multi-FET system 97 can comprise a broken (e.g., fractured) or separated tether (e.g., multi-FET tether 52) as a consequence of micro-transfer printing.

Figure 8:
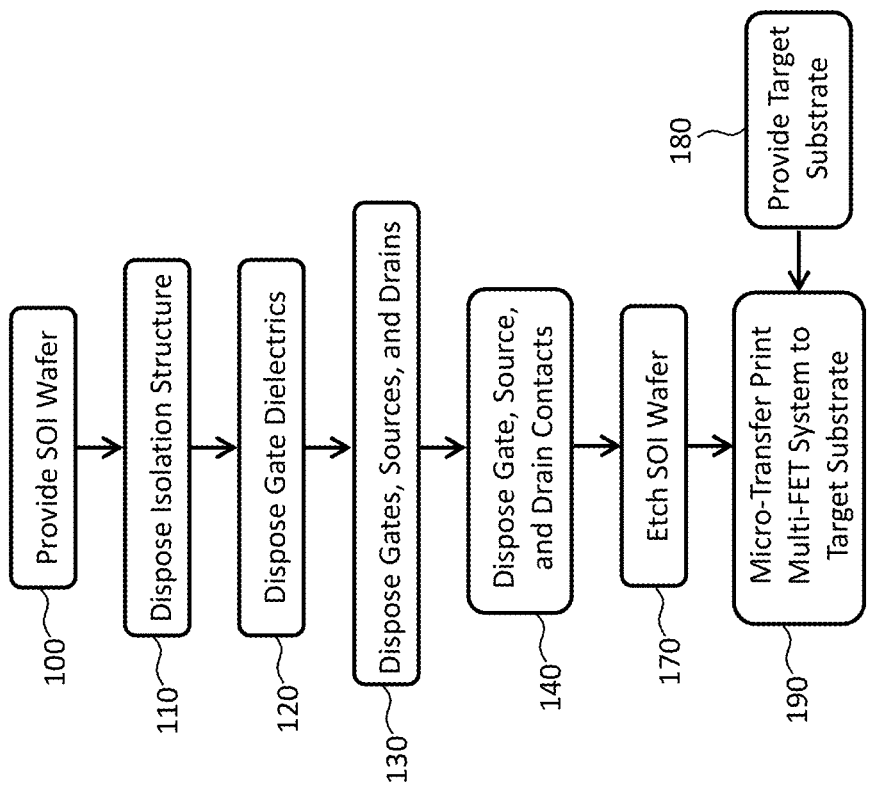

According to embodiments of the present disclosure and as shown in the flow diagram of FIG. 8 and the structures of FIGS. 1A-1E, a method of making a monolithic multi-FET wafer 98 comprises providing in step 100 a semiconductor substrate 90 comprising a bulk layer 10, a dielectric layer 12 disposed on bulk layer 10, and an epitaxial layer 14 disposed on dielectric layer 12. Semiconductor substrate 90 can be a silicon-on-insulator substrate or wafer. Bulk layer 10 and epitaxial layer 14 can both comprise a crystalline semiconductor material and epitaxial layer 14 can comprise a multi-FET area 16. In step 110, an isolation structure 30 is disposed in epitaxial layer 14 Isolation structure 30 extends from an epitaxial layer surface 15 of epitaxial layer 14 through epitaxial layer 14 to dielectric layer 12. Isolation structure 30 can surround multi-FET area 16 and divide multi-FET area 16 into separate FET portions 21. Each FET portion 21 can be substantially rectangular and can form a portion of a field-effect transistor 20. In step 120, multiple gate dielectrics 28 are disposed on epitaxial layer 14 in each multi-FET area 16 and one gate dielectric 28 is disposed in each FET portion 21. Each gate dielectric 28 extends over a different FET portion 21 of the separate FET portions 21 and can contact isolation structure 30 at two separated locations, for example at opposing sides of FET portion 21.

In step 130, a gate 24 is disposed on each gate dielectric 28, a source 22 is disposed on epitaxial layer 14 within each FET portion 21 on a side of gate 24 (and gate dielectric 28), and a drain 26 is disposed on epitaxial layer 14 within each FET portion 21 on a side of gate 24 (and gate dielectric 28) opposite source 22. A portion of epitaxial layer 14 beneath gate 24 and gate dielectric 28 can be channel epitaxy 44, a portion of epitaxial layer 14 beneath source 22 and can be source epitaxy 42, and a portion of epitaxial layer 14 beneath drain 26 can be drain epitaxy 46. Any one or more of channel epitaxy 44, source epitaxy 42, or drain epitaxy 46 can be a doped or partially doped semiconductor to control the conductivity of the channel epitaxy 44, source epitaxy 42, or drain epitaxy 46. Each gate 24, source 22, and drain 26 comprises a separate electrical conductor and, together with epitaxial layer 14 in each FET portion 21, form an FET 20. According to some embodiments, at least sources 22 of two neighboring FET portions 21 are a common source 22 disposed over a portion of isolation structure 30 dividing the two neighboring FET portions 21 or drains 26 of two neighboring FET portions 21 are a common drain 26 disposed over a portion of the isolation structure 30 dividing the two neighboring FET portions 21, or both. Thus, a common source 22 or drain 26 is a part of two neighboring FETs 20 and overlaps a portion of the two FET portions 21 separated by a portion of isolation structure 30.

In step 140, a gate contact 84 is disposed in electrical contact with and electrically connects all of gates 24 of the separate FET portions 21 in multi-FET area 16, a source contact 82 is disposed in electrical contact with and electrically connects all of the sources 22 of the separate FET portions 21 in multi-FET area 16, and a drain contact 86 is disposed in electrical contact with and electrically connects all of the drains 26 of the separate FET portions 21 in multi-FET area 16 so that each of the FETs 20 in monolithic multi-FET transistor 99 are electrically connected in parallel. Gate contact 84, source contact 82, and drain contact 86 can electrically connected one end or two opposing ends of gates 24, sources 22, and drains 26, respectively. According to some embodiments, gate contact 84, source contact 82, and drain contact 86 are disposed at least partially over epitaxial layer 14 in multi-FET area 16 and can be electrically insulated from epitaxial layer 14 and each other by dielectric layers, e.g., silicon dioxide, silicon nitride, or a resin. The structures described with respect to FIG. 8 can all be made using photolithographic methods and materials.

Figure 12A:
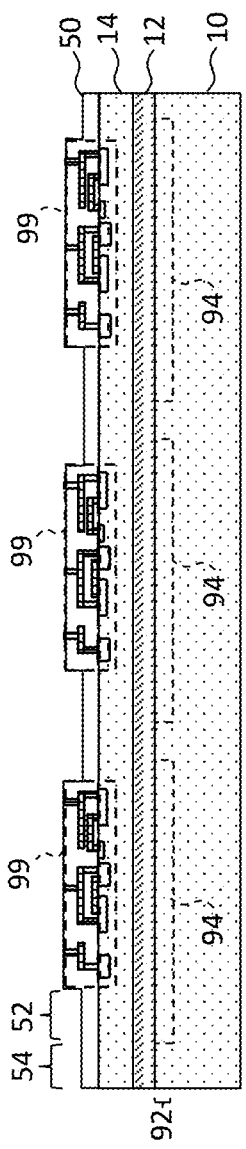
FIGS. 12A-12C are successive cross sections illustrating structures and methods of a multi-FET system according to embodiments of the present disclosure.
Figure 12B:
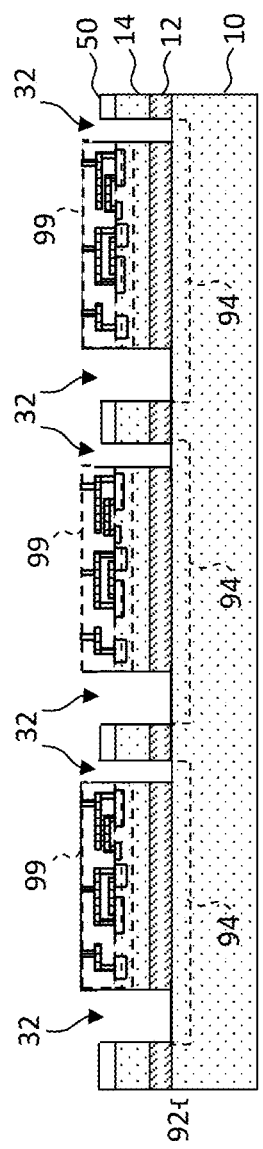
Figure 12C:
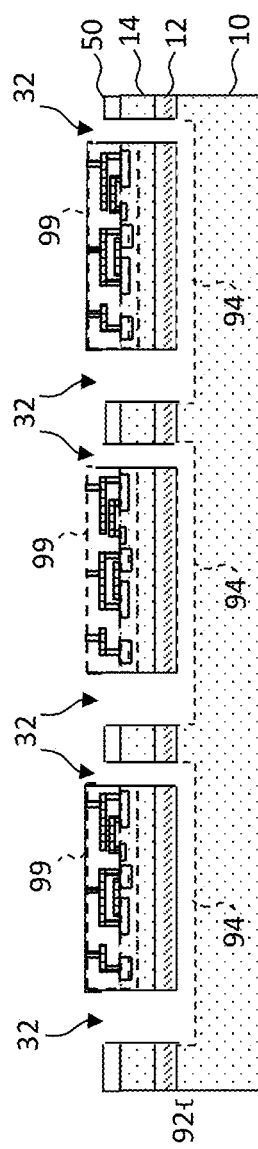

According to embodiments of the present disclosure and as shown in FIGS. 5A and 5B, providing semiconductor substrate 90 can include providing bulk layer 10 with a patterned sacrificial layer 92 comprising separate sacrificial portions 94 and anchors 54 where each monolithic multi-FET transistor 99 is entirely disposed over a sacrificial portion 94 and is physically connected to an anchor 54 with a multi-FET tether 52. According to some embodiments, sacrificial portions 94 are laterally separated from anchors 54. As further illustrated in FIG. 8, a method of making a monolithic multi-FET system 97 comprises etching sacrificial portions 94 in step 170. As shown in more detail in FIGS. 12A-12C, a plurality of monolithic multi-FETs 99 are provided as shown in FIGS. 1A-4 and in steps 100-140 of FIG. 8. As shown in FIG. 12A, an SOI wafer has a bulk layer 10, an insulating dielectric layer 12, and an epitaxial layer 14. Monolithic multi-FET transistor 99 is constructed on and in epitaxial layer 14 and dielectric layers insulating gate, source, and drain contacts 84, 82, 86. A portion of bulk layer 10 forming patterned sacrificial layer 92 on which dielectric layer 12 is disposed comprises sacrificial portions 94. One of the dielectric layers can form multi-FET tether 52 and another or the same dielectric layer can be an encapsulation layer 50. Multi-FET tether 52 can be a portion of encapsulation layer 50 or other dielectric layer disposed on epitaxial layer 14 directly over (e.g., in a direction orthogonal to epitaxial layer surface 15) sacrificial portion 94 and exterior to multi-FET area 16. A portion of patterned sacrificial layer 92 between sacrificial portions 94 (e.g., laterally between) can be anchors 54, as shown in FIGS. 5A and 5B. As shown in FIG. 12B, in step 170 encapsulation layer 50 and other dielectric layers insulating contacts 80, epitaxial layer 14, and dielectric layer 12 are pattern-wise etched to form etch vias 32 (e.g., using photolithographic processes and materials such as photoresist). Given the different materials of the various layers (dielectrics such as encapsulation layer 50 and semiconductor epitaxial layer 14), etch step 170 can require multiple etch steps for the multiple different materials. Etch vias 32 can surround multi-FET area 16 except for multi-FET tether 52 (as shown in FIG. 5A). Etch vias 32 can extend into sacrificial portions 94. Once etch vias 32 are in place, sacrificial portions 94 can be etched through etch vias 32 to release monolithic multi-FET transistor 99 from bulk layer 10 and render monolithic multi-FET transistor 99 micro-transfer printable.

Figure 5D:
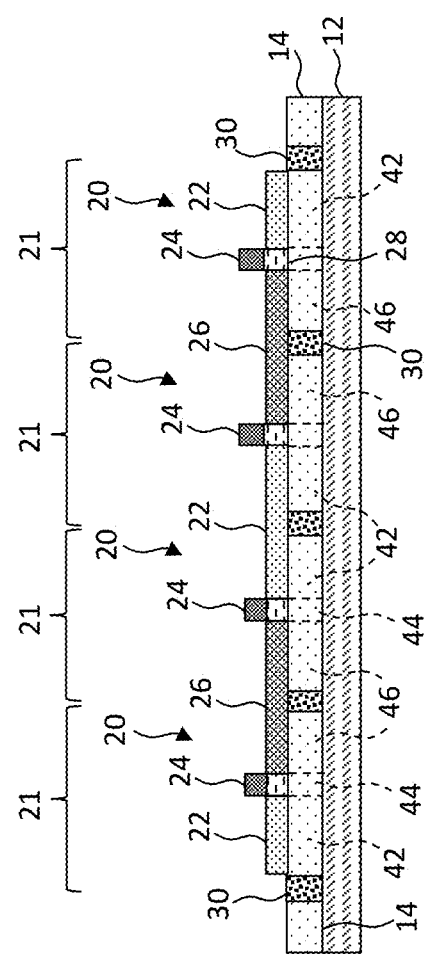
FIG. 5D is a detail of FIGS. 5B and 5C illustrating a cross section of a multi-FET transistor without a bulk layer according to embodiments of the present disclosure.

In step 180, a target substrate 60 is provided and, in step 190, monolithic multi-FET transistor 99 is micro-transfer printed from bulk layer 10 to target substrate 60. Thus, in some embodiments of the present disclosure, monolithic multi-FET transistor 99 does not include bulk layer 10 (e.g., as shown in FIGS. 5C, 5D) and, when disposed on a target substrate 60, dielectric layer 12 can be in contact with target substrate 60, improving thermal contact with target substrate 60 (since bulk layer 10 is not present to impede the flow of heat).

Figure 9:
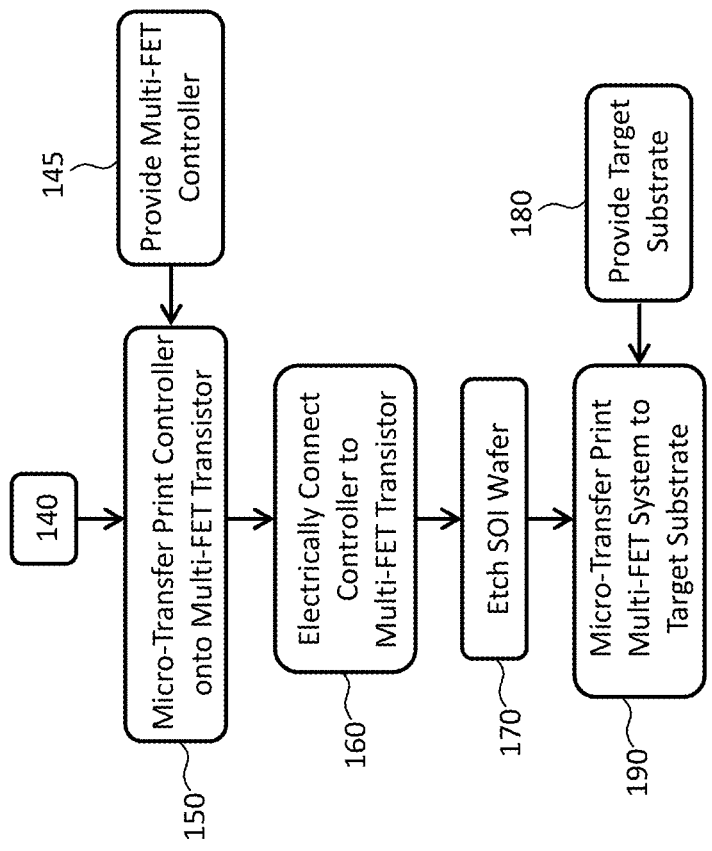
FIGS. 8-11 are flow diagrams illustrating methods of the present disclosure.

According to some embodiments of the present disclosure and as illustrated in FIGS. 7 and 9, a method of making a monolithic multi-FET system 97 comprises providing a monolithic multi-FET transistor 99 (e.g., as illustrated in FIG. 8), providing a multi-FET controller 70 in step 145, and disposing multi-FET controller 70 over or on monolithic multi-FET transistor 99, for example by micro-transfer printing multi-FET controller 70 from a multi-FET controller source wafer onto monolithic multi-FET transistor 99, for example onto an electrically insulating dielectric layer (e.g., encapsulation layer 50) disposed on or a part of monolithic multi-FET transistor 99. The process of micro-transfer printing can break (e.g., fracture) or separate controller tether 72 of controller 70. Multi-FET controller 70 can be electrically connected to monolithic multi-FET transistor 99 with electrical conductors 58 (e.g., electrodes 58) in step 160. As further illustrated in the embodiments of FIG. 9, a method of making a monolithic multi-FET system 97 comprises providing a target substrate 60 in step 180 and micro-transfer printing monolithic multi-FET transistor 99 from bulk layer 10 to target substrate 60 in step 190. Controller 70 can be operable to control monolithic multi-FET transistor 99.

Figures 10, 11:
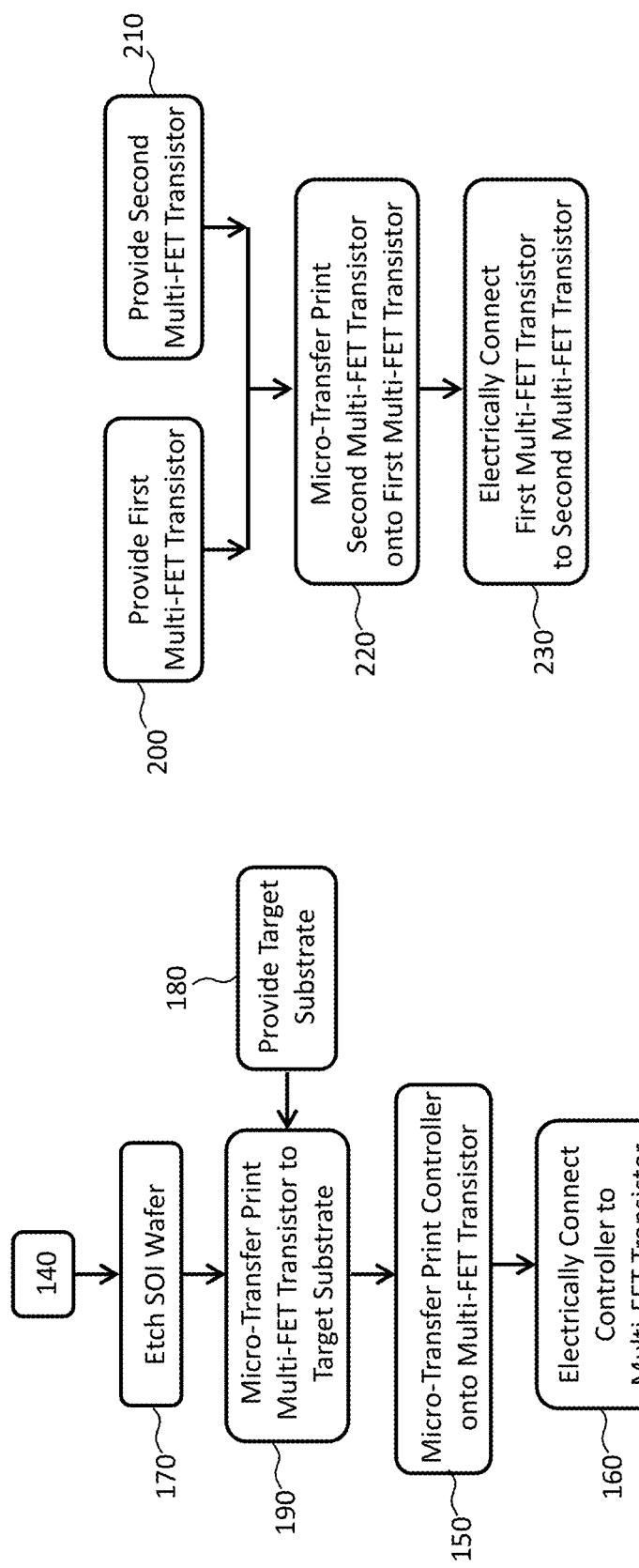

In some embodiments and as shown in FIG. 9, multi-FET controller 70 is disposed in step 150 and electrically connected in step 160 before sacrificial portions 94 of semiconductor substrate 90 (SOI wafer 90) are etched so that monolithic multi-FET transistor 99 and multi-FET controller 70 are micro-transfer printed together as a unit in step 190. As illustrated in the embodiments of FIG. 10, semiconductor substrate 90 (SOI wafer 90) is etched in step 170, target substrate 60 is provided in step 180, and monolithic multi-FET transistor 99 is micro-transfer printed to target substrate 60 in step 190 before micro-transfer printing multi-FET controller 70 to monolithic multi-FET transistor 99 in step 150 and electrically connecting them in step 160. Thus, the monolithic multi-FET transistor 99 micro-transfer printing and electrical connection steps (150, 160) are done on target substrate 60. In some embodiments, the monolithic multi-FET transistor 99 micro-transfer printing (step 150) is done on semiconductor substrate 90 (as in FIG. 9) and electrical connection (step 160) is done on target substrate 60 (as in FIG. 10), for example using photolithographic or printed-circuit board methods and materials.

As shown in FIGS. 6 and 11 and according to some embodiments of the present disclosure, a method of making a monolithic multi-FET system 96 comprises providing a first monolithic multi-FET transistor 99A in step 200 (e.g., as discussed in FIG. 8 steps 100-140), providing a second monolithic multi-FET transistor 99B in step 210 (e.g., as discussed in FIG. 8 steps 100-140), printing (e.g., micro-transfer printing) second monolithic multi-FET transistor 99B on or over first monolithic multi-FET transistor 99A (for example on a dielectric layer such as encapsulation layer 50) in step 220, and electrically connecting in parallel gate contacts 84, source contacts 82, and drain contacts 86 of first and second monolithic multi-FET transistors 99A and 99B. Monolithic multi-FET transistor system 96 can then be micro-transfer printed to a target substrate 60, for example with steps 170-190 and as discussed in FIG. 9 with respect to the monolithic multi-FET transistor system 97.

In some embodiments, second monolithic multi-FET transistor 99B is printed (e.g., micro-transfer printed) onto and electrically connected to first monolithic multi-FET transistor 99A while first monolithic multi-FET transistor 99A is still disposed on semiconductor substrate 90 so that steps 220 and 230 are done on semiconductor substrate 90. By providing step 220 and 230 on semiconductor substrate 90, higher-resolution photolithographic process can be performed on relatively smaller substrates (e.g., semiconductor substrate 90). In some embodiments, first monolithic multi-FET transistor 99A is micro-transfer printed to a target substrate 60 before second monolithic multi-FET transistor 99B is micro-transfer printed onto and electrically connected to first monolithic multi-FET transistor 99A so that steps 220 and 230 are done on target substrate 60 with lower-resolution photolithographic process on relatively larger substrates (e.g., target substrate 60). As is known in the photolithographic and printed-circuit board industries, providing high resolution processing on relatively large substrates can be difficult and expensive. In some embodiments, second monolithic multi-FET transistor 99B is micro-transfer printed onto first monolithic multi-FET transistor 99A while first monolithic multi-FET transistor 99A is still disposed on semiconductor substrate 90 so that step 220 is done on semiconductor substrate 90 and first and second monolithic multi-FET transistors 99A, 99B are electrically connected after the first and second monolithic multi-FET transistors 99A, 99B are printed (e.g., micro-transfer printed) onto target substrate 60.

Embodiments of the present disclosure can be operated by providing electrical power to multi-FET controller 70, e.g., through contact pads 56 on target (destination) substrate 60, for example as illustrated in FIG. 7. Monolithic multi-FET transistor(s) 99 receive current and control signals (e.g., signals provided to gate contact(s) 84 from multi-FET controller 70 to control power conducted through monolithic multi-FET transistor(s) 99.

Embodiments of the present disclosure provide a monolithic multi-FET transistor 99 with improved density, efficiency, and source wafer utilization. Conventional power transistors are packaged; such packages are expensive and relatively large. Furthermore, in order to package a transistor, the transistor is singulated from a source wafer, typically by scribing and breaking, either using a diamond or laser scribe. Scribe lines have a minimum size (e.g., due to a size of the scribe and level of precision for its placement plus some margin) and require source-wafer area that cannot be used for other purposes, reducing the source wafer semiconductor utilization. By integrating multiple FETs into a common monolithic multi-FET transistor 99 structure, only a single package is used. In the case of a single serpentine transistor with an equivalent gate length, monolithic multi-FET transistors 99 of the present disclosure have a reduced resistance and therefore improved power efficiency. Multiple, separate FETs that are integrated simply by micro-transfer printing still each require an anchor portion 54 of a semiconductor substrate 90 (semiconductor wafer), reducing source wafer semiconductor utilization. In contrast, embodiments of monolithic multi-FET transistors 99 as disclosed have only one anchor 54 per multi-FET area 16 and monolithic multi-FET transistor 99, rather than on tether per FET 20, thereby improving semiconductor substrate 90 utilization. Therefore, according to embodiments of the present disclosure, monolithic multi-FET transistors 99 provide improved performance, improved semiconductor substrate 90 utilization, and improved integration and reduced size.

Any one or combination of electrodes 58, contact pads 56, gate contacts 84, source contacts 82, drain contacts 86, gates 24, sources 22, and drains 26 can be electrical conductors that are or comprise a metal, such as aluminum, tungsten, titanium, tin, tantalum, silver, copper, or gold. In some embodiments, the electrical conductors are a highly heat-conductive metal, for example copper. Dielectric materials and electrical conductors can be patterned using photolithographic and integrated circuit methods and the adhesive layer 62 can be coated, for example spin or curtain coated, or laminated on semiconductor substrate 90 or layers on semiconductor substrate 90. Crystalline silicon and compound semiconductor substrates and structures, such as transistor structures, can also be formed using integrated circuit manufacturing methods.

In some embodiments of the present disclosure, power transistors are radio frequency (RF) transistors and the monolithic multi-FET transistor 99 can be used as or in a power amplifier in electronic devices, for example mobile devices or in automotive applications.

In embodiments of the present disclosure, semiconductor substrate 90 can comprise a semiconductor or compound semiconductor. Semiconductor substrate 90 can have two relatively flat and substantially parallel opposing sides and can be any structure having a process side suitable for the deposition, processing, and patterning of active electronic structures useful in forming an FET 20. Such structures can include patterned semiconductor structures, doped semiconductor structures, dielectrics such as silicon oxides and silicon nitrides, and conductors, such as aluminum, copper, gold, silver, titanium, tantalum, and tin or alloys of such materials. In some embodiments, electrodes 58 or other electrical conductors in or connected to FETs 20 are copper. For example, photolithographic processes for making integrated circuits can be employed with suitable semiconductor substrates 90. Semiconductor substrates 90 can include semiconductor materials such as silicon or compound semiconductor materials composed of two or more elements from different groups of the periodic table such as a III-V or II-VI semiconductor. In some embodiments, semiconductor substrate 90 is a crystalline semiconductor substrate 90 such as a crystalline silicon semiconductor in which circuits, such as FETs or circuits comprising FETs, can be formed using photolithographic processes. In some embodiments, semiconductor substrate 90 includes compound semiconductor materials composed of two or more elements from different groups of the periodic table, such as a III-V or II-VI semiconductor, and is a crystalline semiconductor substrate 90 such as a crystalline semiconductor suitable for high-performance power field-effect transistors 20 made using photolithographic processes.

In embodiments of the present disclosure, encapsulation layer 50, dielectric layer 12, gate dielectric 28, or isolation structure 30 can be an oxide or nitride, for example silicon oxide, silicon dioxide, silicon nitride, a polymer such as epoxy, or another insulator. Encapsulation layer 50 and isolation structure 30 can be or comprise a chemically etch-resistant material. In some embodiments, encapsulation layer 50 comprises at least a portion of a multi-FET tether 52. As used herein, an etch-resistant material is a material that resists etching by whatever etchant is used to etch sacrificial portions 94.

For a discussion of micro-transfer printing techniques applicable to methods disclosed herein see U.S. Pat. Nos. 8,722,458, 7,622,367 and 8,506,867, each of which is hereby incorporated by reference in their entirety. Micro-transfer printing using compound micro-assembly structures and methods can also be used with the present disclosure, for example as described in U.S. patent application Ser. No. 14/822,868, filed Aug. 10, 2015, entitled Compound Micro Assembly Strategies and Devices, which is hereby incorporated by reference in its entirety. U.S. patent application Ser. No. 14/743,981, filed Jun. 18, 2015, entitled Micro Assembled LED Displays and Lighting Elements, incorporated herein by reference describes micro-transfer printing structures and processes useful with optical transducers.

Semiconductor substrate 90 and monolithic multi-FET transistor 99 can take a variety of forms, shapes, sizes, and materials. Epitaxial layer 14 can have a thickness, for example of no greater than 20 microns, no greater than 10 microns, or no greater than 5 microns. The semiconductor substrate 90 can have a thickness, for example of less than 10 microns, less than 5 microns, or less than 1 micron. Alternatively, the semiconductor substrate 90 can have a thickness greater than 0.5 microns, greater than 1 micron, greater than 2 microns, or greater than 5 microns. Such a variety of sizes can enable highly integrated and small structures useful in a corresponding variety of electronic systems. The monolithic multi-FET transistor 99 can have a variety of thicknesses, for example 10 nm to 10 microns. The multi-FET tethers 52 can have a thickness of several nm (e.g., 50, 100, 200, 500, 700, or 800 nm) to a few μm (e.g., 1-5 μm), for example 600 nm to 1.5 μm.

In some embodiments of the present disclosure, monolithic multi-FET transistors 99 are chiplets, small integrated structures, for example bare die, that are printed (e.g., micro-transfer printed) to a target substrate 60 and electrically connected using photolithographic materials and methods. Monolithic multi-FET transistors 99 can be packaged and can be surface-mount devices. In various embodiments, monolithic multi-FET transistors 99 can have at least one of a width, a length, and a height from 2 to 50 μm (e.g., 2 to 5 μm, 5 to 10 μm, 10 to 20 μm, or 20 to 50 μm). Such small substrate elements provide a high degree of integration and material utilization and consequently reduced manufacturing costs and improved performance. The integrated monolithic multi-FET transistor 99 can be a surface-mount device.

As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a patterned sacrificial layer 92 or sacrificial portion 94 is considered "on" a substrate when a layer of sacrificial material or sacrificial portion 94 is on top of the substrate, when a portion of the substrate itself is the patterned sacrificial layer 92, or when the patterned sacrificial layer 92 or sacrificial portion 66 comprises material on top of the substrate or a portion of the substrate itself.

Having described certain embodiments, it will now become apparent to one of skill in the art that other embodiments incorporating the concepts of the disclosure may be used. Therefore, the claimed invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

C connection point
$C_{L1}$ connection length
$C_{L2}$ connection length
$T_1$ terminal connection
$T_2$ terminal connection
10 bulk layer
12 dielectric layer/insulating layer
14 epitaxial layer
15 epitaxial layer surface
16 multi-FET area
20 field-effect transistor (FET)
21 FET portion
22 source
24 gate
26 drain
28 gate dielectric
29 centerline
30 isolation structure/deep-trench isolation (DTI) dielectric
32 etch via
42 source epitaxy
44 channel epitaxy
46 drain epitaxy
50 encapsulation layer
52 multi-FET tether
54 anchor
56 contact pad
58 electrode/electrical conductor
60 target substrate
62 adhesive/adhesive layer
70 multi-FET controller/controller
72 controller tether
80 contact
82 source contact
84 gate contact
86 drain contact
90 semiconductor substrate/SOI wafer
92 patterned sacrificial layer
94 sacrificial portion
96 monolithic multi-FET system
97 monolithic multi-FET system
98 monolithic multi-FET wafer
99 monolithic multi-FET transistor
99A first monolithic multi-FET transistor
99B second monolithic multi-FET transistor
100 provide SOI wafer step
110 dispose isolation structure step
120 dispose gate dielectrics step
130 dispose gates, sources, and drains step
140 dispose gate, source, and drain contacts step
145 provide multi-FET controller step
150 micro-transfer print controller onto multi-FET transistor step
160 electrically connect controller to multi-FET transistor step
170 etch SOI wafer step
180 provide target substrate step
190 micro-transfer print multi-FET system to target substrate step
200 provide first multi-FET transistor step
210 provide second multi-FET transistor step
220 micro-transfer print second multi-FET transistor onto first multi-FET transistor step
230 electrically connect first multi-FET transistor to second multi-FET transistor step

What is claimed:

1. A monolithic multi-FET transistor, comprising:
 a semiconductor substrate comprising a bulk layer, a dielectric layer disposed on the bulk layer, and an epitaxial layer disposed on the dielectric layer, the bulk layer and the epitaxial layer both comprising a crystalline semiconductor material, and the epitaxial layer comprising a multi-FET area;
 an isolation structure disposed in the epitaxial layer and extending from the dielectric layer through the epitaxial layer to a surface of the epitaxial layer opposite the dielectric layer, the isolation structure surrounding the multi-FET area and dividing the multi-FET area into separate FET portions;
 for each separate FET portion of the separate FET portions:
  a respective gate dielectric that extends over the separate FET portion that contacts the isolation structure at two separated locations;
  a respective gate disposed on the respective gate dielectric;
  a respective source disposed on the epitaxial layer on a side of the respective gate; and a respective drain disposed on the epitaxial layer on a side of the respective gate opposite the respective source, wherein at least the respective gate, the respective source, the respective drain and the separate FET portion of the epitaxial layer form a field-effect transistor (FET); and a gate contact electrically connecting the respective gate of each of the separate FET portions, a source contact electrically connecting the respective source of each of the separate FET portions, and a drain contact electrically connecting the respective drain of each of the FET portions, wherein at least one of (i) the respective source for two neighboring FET portions of the separate FET portions is a common source disposed over at least a portion of the isolation structure dividing the two neighboring FET portions and (ii) the respective drain for two neighboring FET portions is a common drain disposed over at least a portion of the isolation structure dividing the two neighboring FET portions.

2. The monolithic multi-FET transistor of claim 1, wherein the separate FET portions comprise three or more separate FET portions and at least the respective source for two first neighboring FET portions is a common source disposed over the isolation structure separating the two first neighboring FET portions and the respective drains for two second neighboring FET portions is a common drain disposed over the isolation structure separating the two second neighboring FET portions.

3. The monolithic multi-FET transistor of claim 1, wherein the isolation structure divides the multi-FET area into a one-dimensional array of separate FET portions.

4. The monolithic multi-FET transistor of claim 1, wherein the isolation structure divides the multi-FET area into a two-dimensional array of separate FET portions.

5. The monolithic multi-FET transistor of claim 4, wherein the two neighboring FET portions are first neighboring FET portions adjacent in a first dimension of the two-dimensional array and two other neighboring FET portions in a second dimension of the two-dimensional array are second neighboring FET portions and the respective gate of the second neighboring FET portions is a common gate disposed over the isolation structure dividing the two second neighboring FET portions, the respective source of the second neighboring FET portions is a common source disposed over the isolation structure dividing the two second neighboring FET portions, and the respective drain of the second neighboring FET portions are a common drain disposed over the isolation structure dividing the two second neighboring FET portions.

6. The monolithic multi-FET transistor of claim 1, wherein the semiconductor substrate comprises silicon.

7. The monolithic multi-FET transistor of claim 1, wherein the semiconductor substrate comprises a compound semiconductor.

8. The monolithic multi-FET transistor of claim 1, wherein the epitaxial layer and the bulk layer comprise a common material.

9. The monolithic multi-FET transistor of claim 1, wherein the epitaxial layer and the bulk layer comprise different materials.

10. The monolithic multi-FET transistor of claim 1, wherein the semiconductor substrate is a silicon-on-insulator substrate.

11. The monolithic multi-FET transistor of claim 1, wherein the dielectric layer is a buried oxide layer.

12. The monolithic multi-FET transistor of claim 1, wherein the respective gate dielectric is a gate oxide.

13. The monolithic multi-FET transistor of claim 1, wherein the monolithic multi-FET transistor is a power transistor.

14. The monolithic multi-FET transistor of claim 1, wherein (i) the respective gate is linear, (ii) the respective source is linear, (iii) the respective drain is linear, or (iv) any combination of (i), (ii), and (iii).

15. The monolithic multi-FET transistor of claim 1, wherein (i) the respective gate has a gate end and the gate contact connects to the respective gate at the gate end, (ii) the respective source has a source end and the source contact connects to the respective source at the source end, (iii) the respective drain has a drain end and the drain contact connects to the respective drain at the drain end, or (iv) any combination of (i), (ii), and (iii).

16. The monolithic multi-FET transistor of claim 1, wherein (i) the respective gate has two opposing gate ends and the gate ends are both electrically connected with the gate contact, (ii) the respective source has two opposing source ends and the source ends are both electrically connected with the source contact, (iii) the respective drain has two opposing drain ends and the drain ends are both electrically connected with the drain contact, or (iv) any combination of (i), (ii), and (iii).

17. The monolithic multi-FET transistor of claim 1, wherein (i) the gate contact is disposed at least partially over the respective gate, (ii) the source contact is disposed at least partially over the respective source, (iii) the drain contact is disposed at least partially over the respective drain, or (iv) any combination of (i), (ii), and (iii).

18. The monolithic multi-FET transistor of claim 1, wherein $R_C<(R_E-R_T)$, where $R_C$ is the sum of the resistances of contact portions of the gate contact, source contact, or drain contact, $R_T$ is the resistance of the respective gate, the respective source, or the respective drain, respectively, and $R_E$ is the resistance of an equivalent gate, an equivalent source, or an equivalent drain, respectively.

19. The monolithic multi-FET transistor of claim 1, wherein (i) the gate contact is more electrically conductive than the respective gate, (ii) the source contact is more electrically conductive than the respective source, (iii) the drain contact is more electrically conductive than the respective drain, or (iv) any combination of (i), (ii), and (iii).

20. A monolithic multi-FET wafer, comprising a plurality of monolithic multi-FET transistors of claim 1, wherein the semiconductor substrate is common to the plurality of monolithic multi-FET transistors.

21. The monolithic multi-FET wafer of claim 20, wherein the bulk layer comprises a sacrificial layer comprising separate sacrificial portions and anchor portions and each of the plurality of monolithic multi-FET transistors is entirely disposed over a sacrificial portion and is physically connected to an anchor portion of the anchor portions with at least one tether.

* * * * *